(12) United States Patent
Nagai

(10) Patent No.: US 8,390,021 B2
(45) Date of Patent: Mar. 5, 2013

(54) SEMICONDUCTOR LIGHT-EMITTING DEVICE, LIGHT-EMITTING MODULE, AND ILLUMINATION DEVICE

(75) Inventor: Hideo Nagai, Osaka (JP)

(73) Assignee: Panasonic Corporation, Osaka (JP)

( * ) Notice: Subject to any disclaimer, the term of this patent is extended or adjusted under 35 U.S.C. 154(b) by 107 days.

(21) Appl. No.: 13/143,178

(22) PCT Filed: Jun. 1, 2010

(86) PCT No.: PCT/JP2010/003660
§ 371 (c)(1),
(2), (4) Date: Jul. 1, 2011

(87) PCT Pub. No.: WO2010/146783
PCT Pub. Date: Dec. 23, 2010

(65) Prior Publication Data
US 2011/0266579 A1    Nov. 3, 2011

(30) Foreign Application Priority Data
Jun. 15, 2009   (JP) ................................ 2009-142573

(51) Int. Cl.
*H01L 33/38* (2010.01)
*H01L 33/50* (2010.01)

(52) U.S. Cl. .................................. 257/99; 257/E33.061
(58) Field of Classification Search .................. None
See application file for complete search history.

(56) References Cited

U.S. PATENT DOCUMENTS

| | | | | |
|---|---|---|---|---|
| 6,885,035 B2 * | 4/2005 | Bhat et al. | ....................... | 257/99 |
| 7,285,801 B2 * | 10/2007 | Eliashevich et al. | ............ | 257/96 |
| 7,417,259 B2 * | 8/2008 | Sakai et al. | ..................... | 257/88 |
| 7,420,221 B2 * | 9/2008 | Nagai | ............................. | 257/98 |
| 7,675,075 B2 * | 3/2010 | Nagai | ............................. | 257/90 |
| 7,755,095 B2 * | 7/2010 | Nagai | ............................. | 257/88 |
| 7,880,185 B2 * | 2/2011 | Nagai | ............................. | 257/90 |
| 7,956,368 B2 * | 6/2011 | Nagai et al. | ..................... | 257/93 |
| 7,968,903 B2 * | 6/2011 | Unno | ............................. | 257/99 |
| 8,030,670 B2 * | 10/2011 | Kim et al. | ..................... | 257/88 |
| 8,120,047 B2 * | 2/2012 | Kim et al. | ..................... | 257/94 |

(Continued)

FOREIGN PATENT DOCUMENTS

| | | |
|---|---|---|
| JP | 07-030153 | 1/1995 |
| JP | 2005-039264 | 2/2005 |

(Continued)

*Primary Examiner* — Thomas L Dickey
*Assistant Examiner* — Joseph Schoenholtz

(57) ABSTRACT

A semiconductor light-emitting device having a substrate on which a semiconductor multilayer film is disposed, the semiconductor multilayer film having a layered structure in which a first conductive layer, a light-emitting layer and a second conductive layer are layered above the substrate from bottom to top in the stated order, and being divided into portions by grooves extending perpendicular to the substrate, each portion having a diode structure and serving as a light-emitting element 12, each light-emitting element 12 having a hole 22 in a central portion thereof in plan view, the hole 22 penetrating through the second conductive layer 18 and the light-emitting layer 16 and reaching the first conductive layer 14, and comprising: a first electrode 24 inserted in the hole 22 and having a columnar shape, one end thereof being connected to the first conductive layer 14 at the bottom of the hole 22, and the other end protruding from an opening of the hole 22; and a second electrode 26 formed on the second conductive layer 18 and having an annular shape surrounding the opening of the hole 22.

11 Claims, 27 Drawing Sheets

U.S. PATENT DOCUMENTS

| | | | |
|---|---|---|---|
| 8,138,516 B2* | 3/2012 | Unno | 257/98 |
| 8,198,640 B2* | 6/2012 | Han | 257/81 |
| 8,207,548 B2* | 6/2012 | Nagai | 257/98 |
| 8,242,509 B2* | 8/2012 | Song | 257/76 |
| 2002/0139987 A1* | 10/2002 | Collins et al. | 257/88 |
| 2003/0189829 A1 | 10/2003 | Shimizu et al. | |
| 2005/0236637 A1* | 10/2005 | Zhao et al. | 257/99 |
| 2005/0242362 A1 | 11/2005 | Shimizu et al. | |
| 2006/0160409 A1 | 7/2006 | Shimizu et al. | |
| 2006/0180818 A1* | 8/2006 | Nagai et al. | 257/89 |
| 2006/0284195 A1* | 12/2006 | Nagai | 257/98 |
| 2007/0007584 A1* | 1/2007 | Hwang et al. | 257/324 |
| 2008/0149945 A1* | 6/2008 | Nagai | 257/88 |
| 2008/0179602 A1* | 7/2008 | Negley et al. | 257/88 |
| 2008/0211416 A1* | 9/2008 | Negley et al. | 315/193 |
| 2009/0134420 A1* | 5/2009 | Nagai | 257/98 |
| 2009/0134425 A1* | 5/2009 | Nagai | 257/99 |
| 2010/0078657 A1 | 4/2010 | Nagai | |

FOREIGN PATENT DOCUMENTS

| | | |
|---|---|---|
| JP | 2007-042806 | 2/2007 |
| JP | 3989794 | 7/2007 |
| JP | 2007-529105 | 10/2007 |
| JP | 4160881 | 7/2008 |
| JP | 2008-270563 | 11/2008 |
| JP | 2009-081469 | 4/2009 |

* cited by examiner

FIG. 8
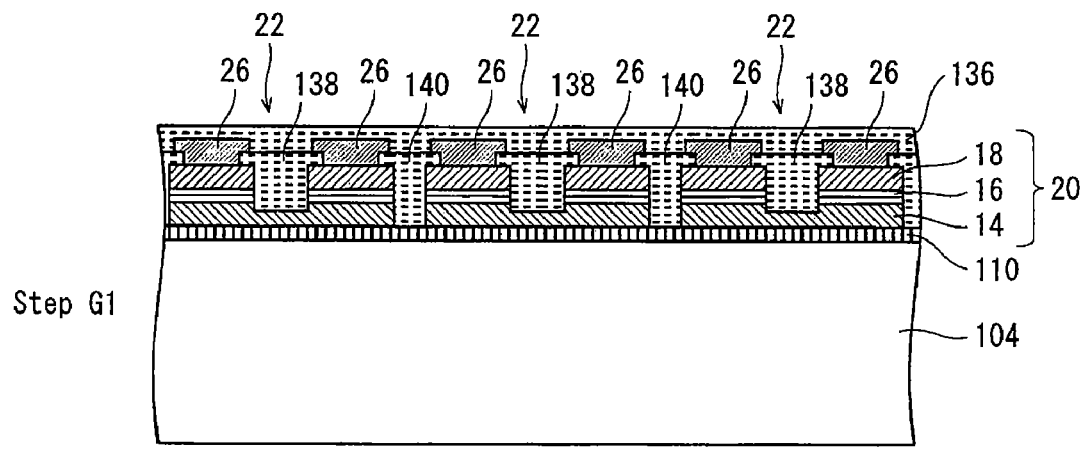
Step G1
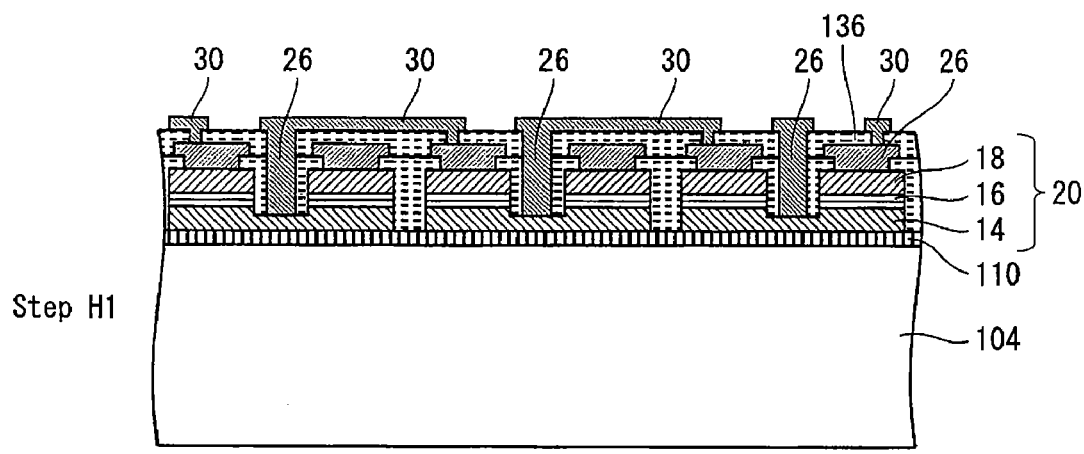
Step H1
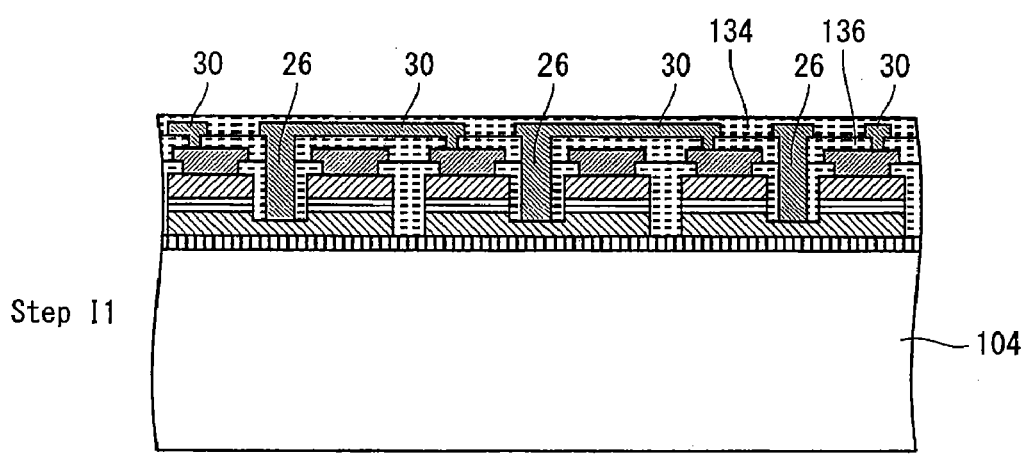
Step I1

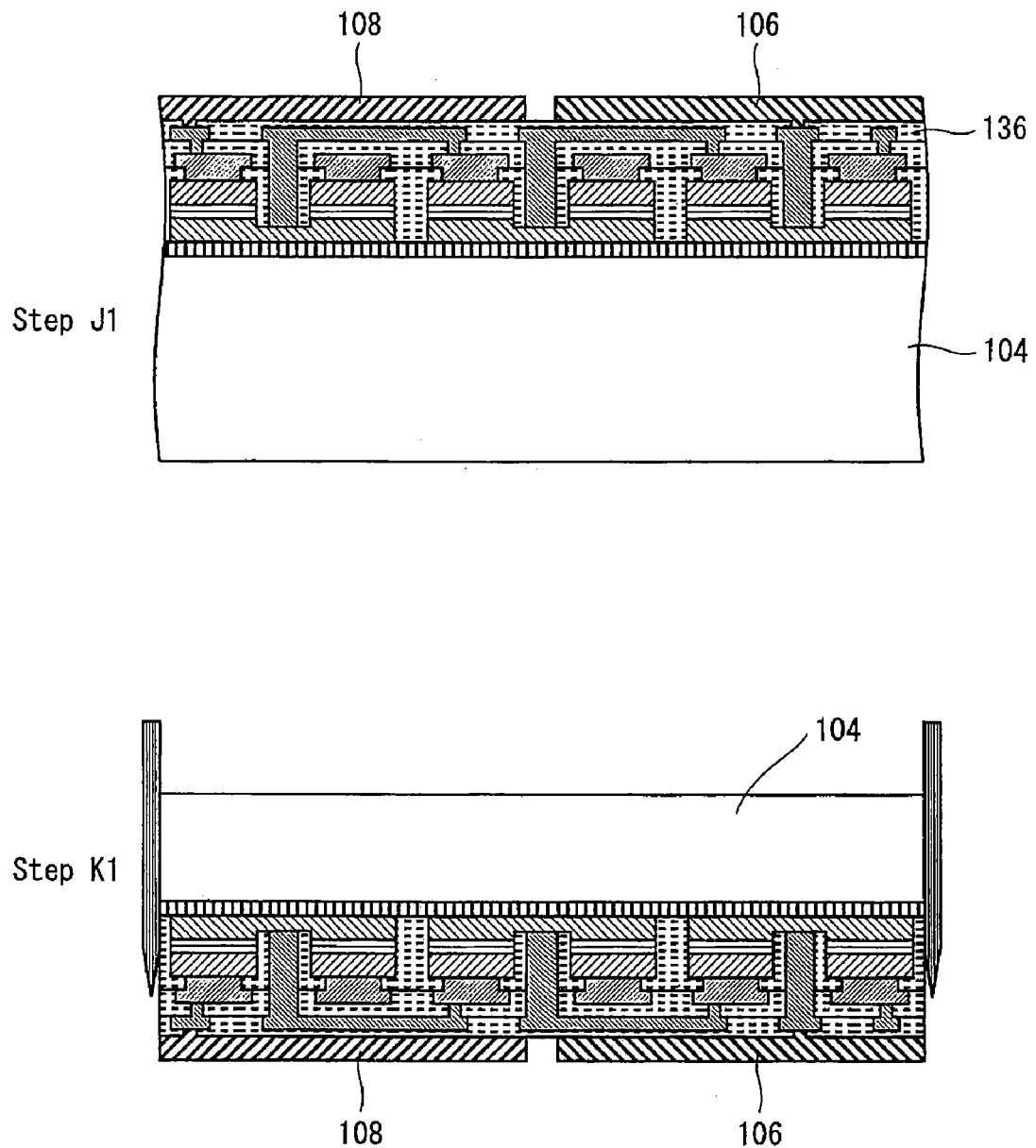

FIG. 16
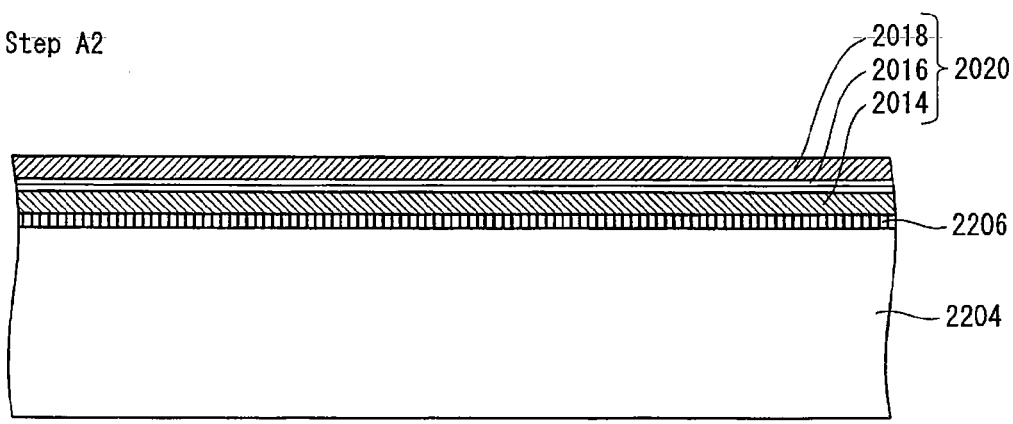
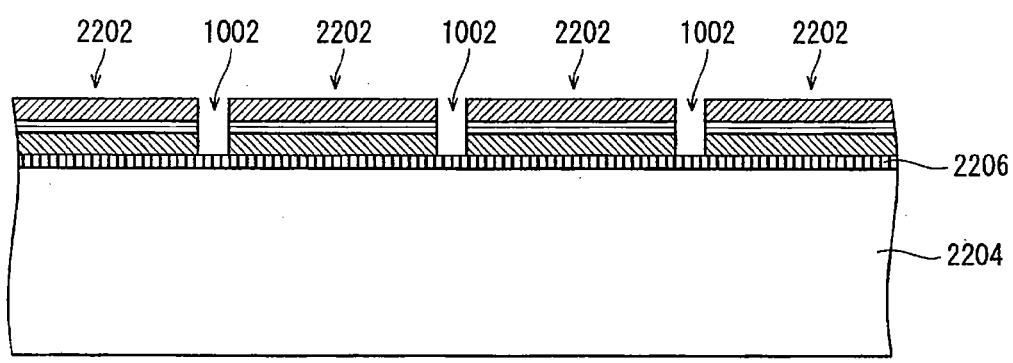
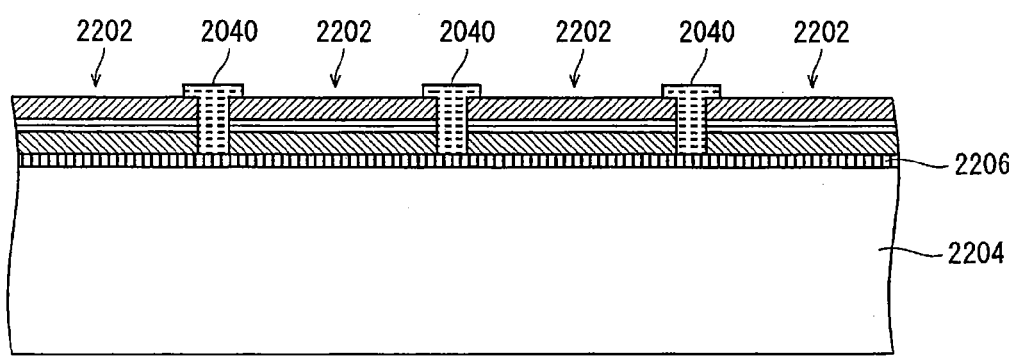

FIG. 17
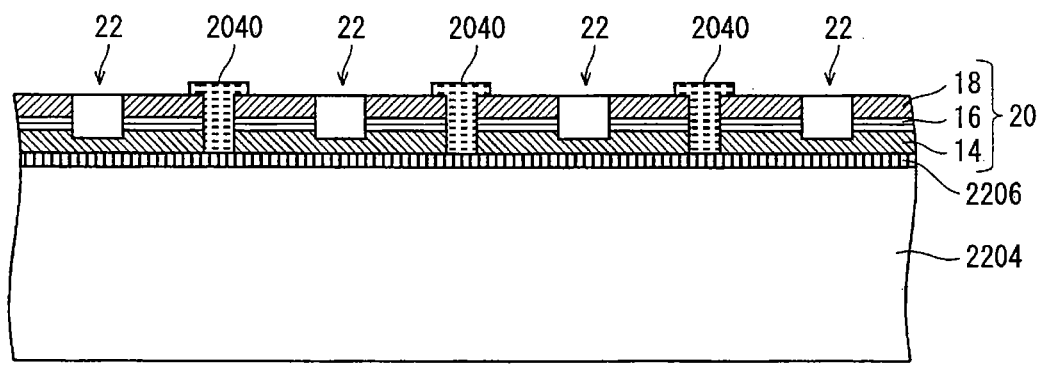
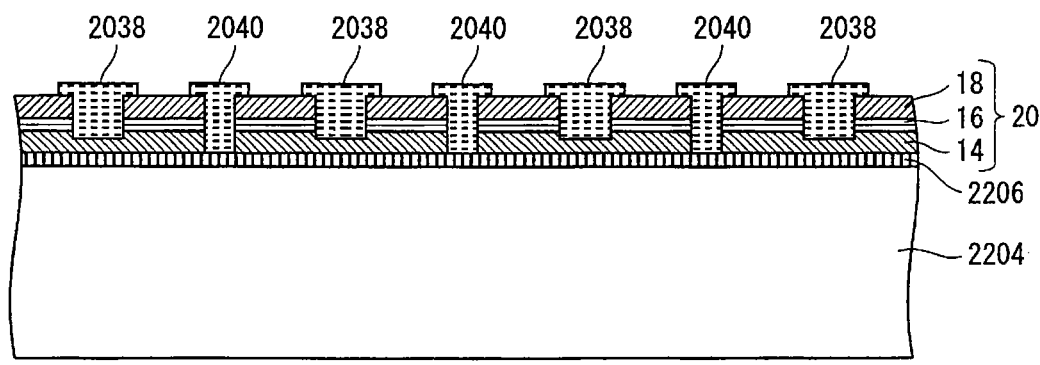
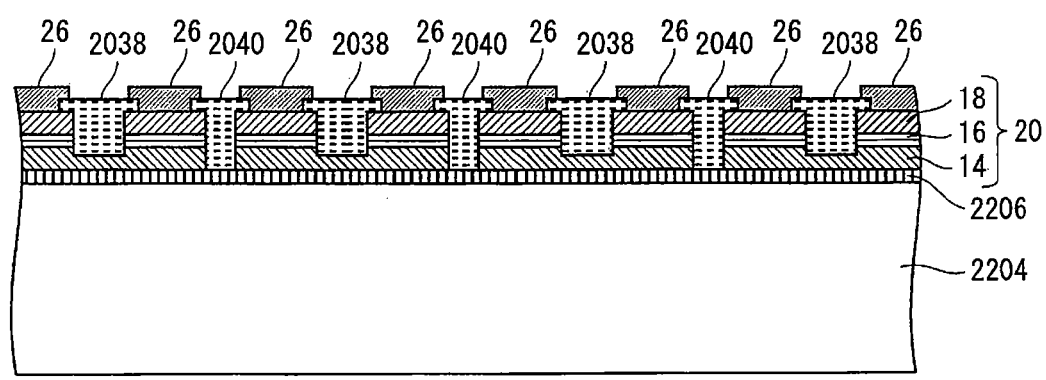

FIG. 18
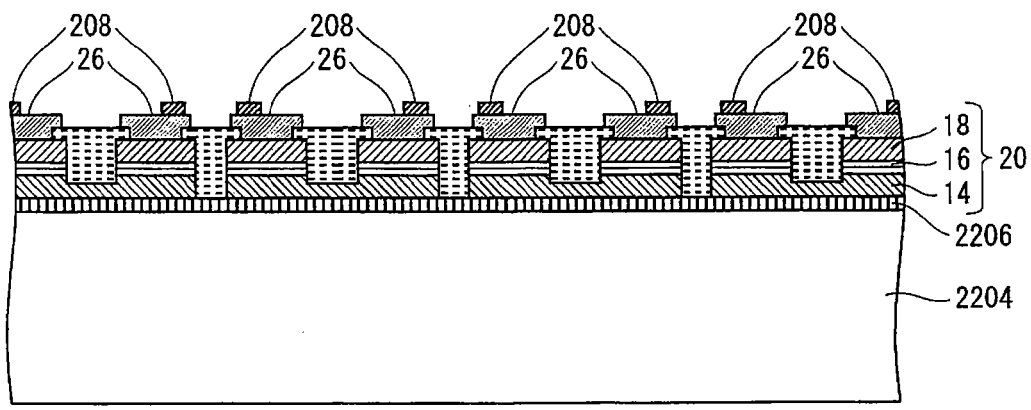
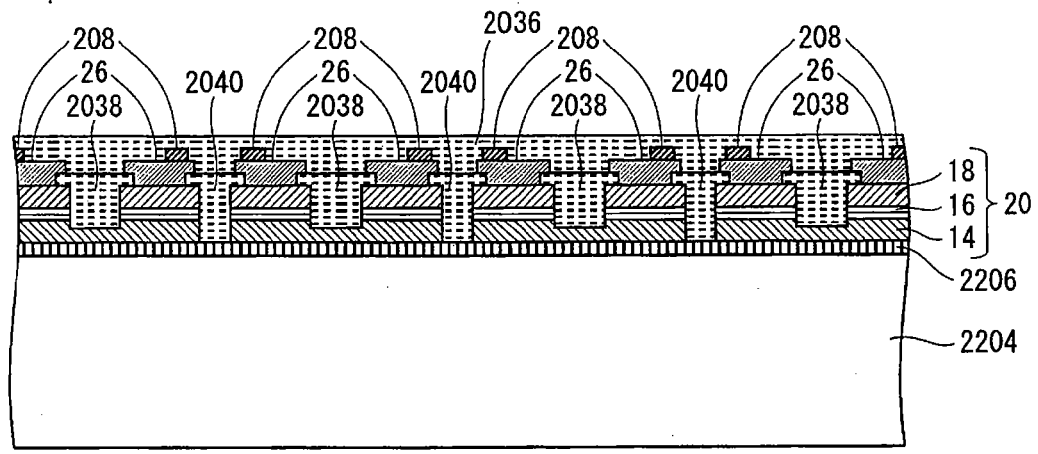
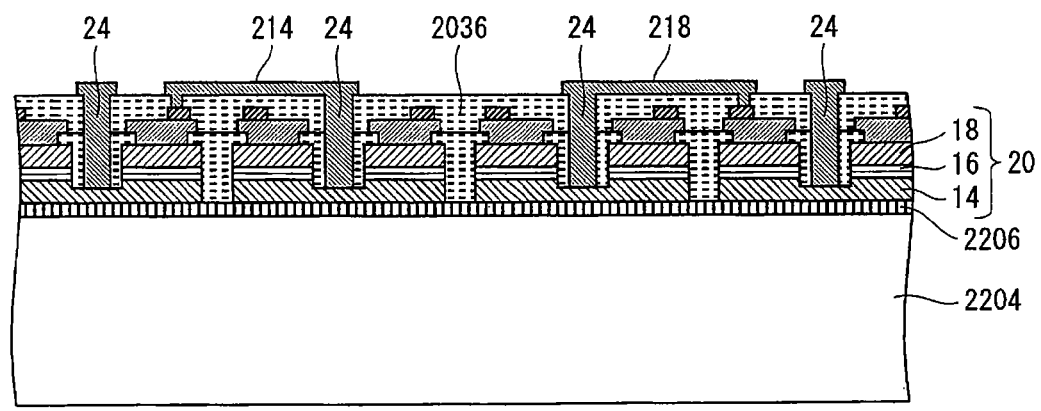

FIG. 19
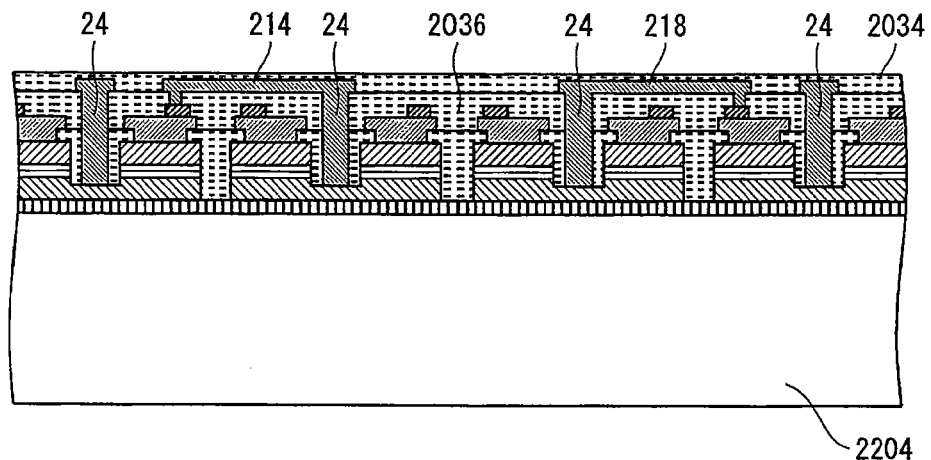
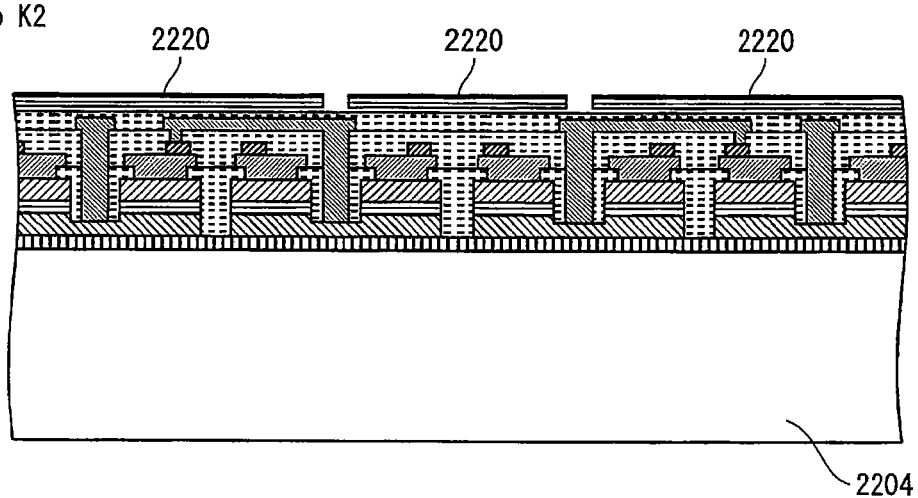
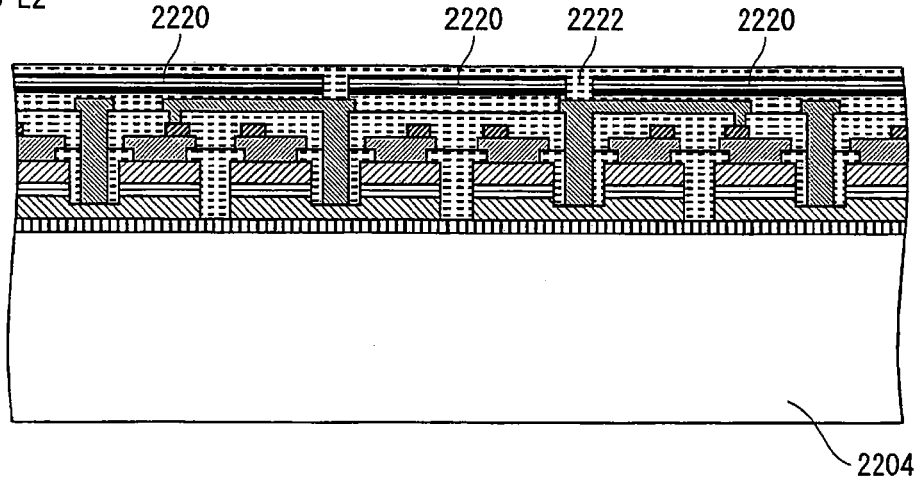

FIG. 20
Step M2
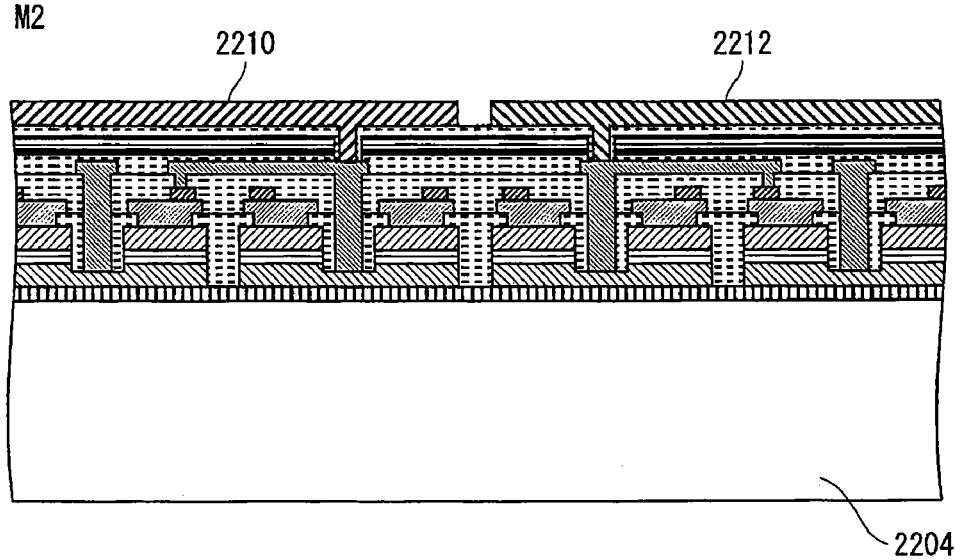
Step N2
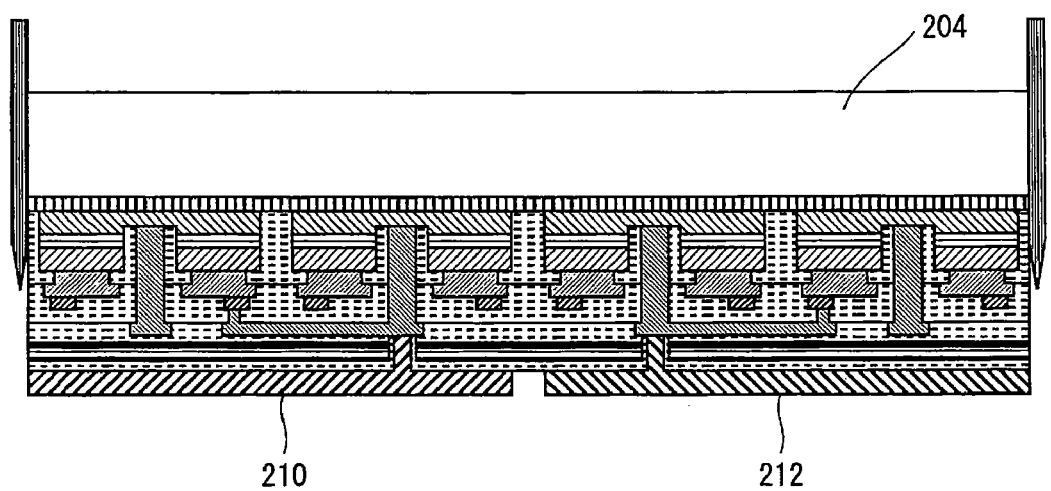

FIG. 24
Step A3
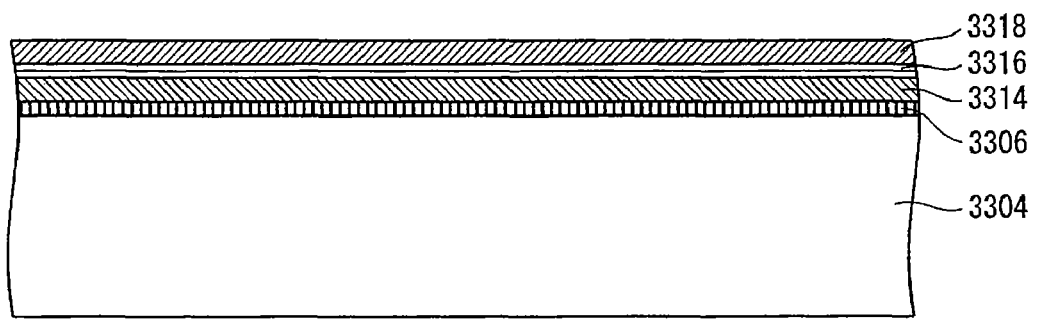
Step B3
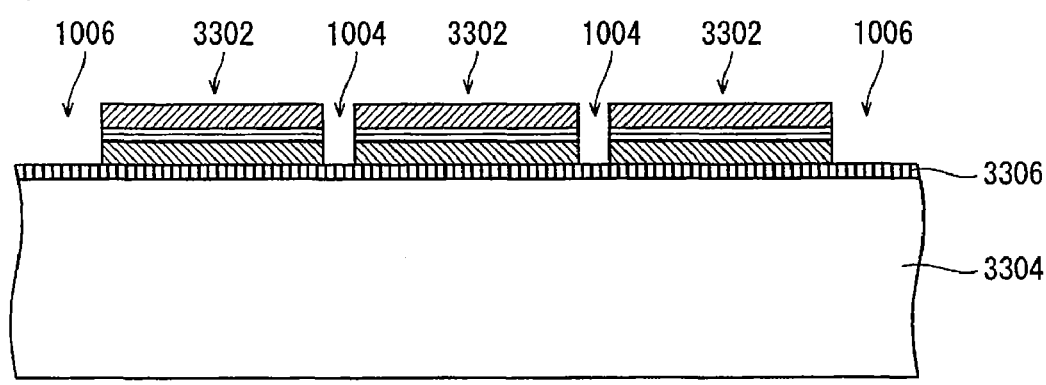
Step C3
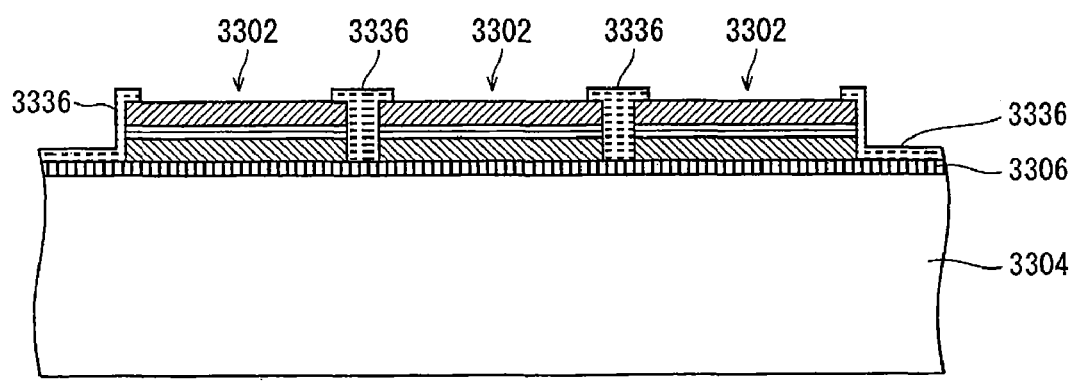

FIG. 25
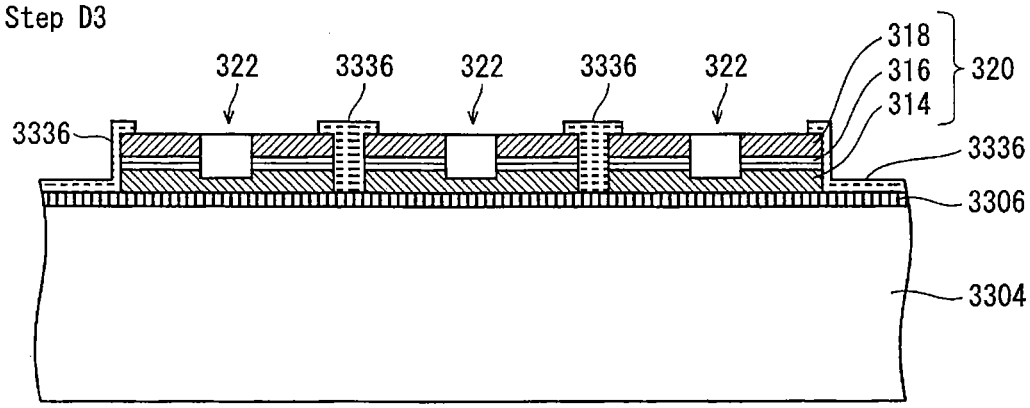
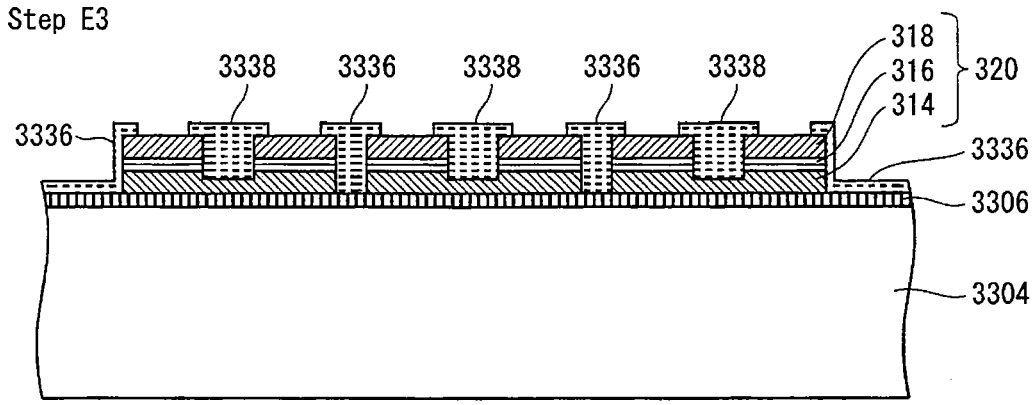
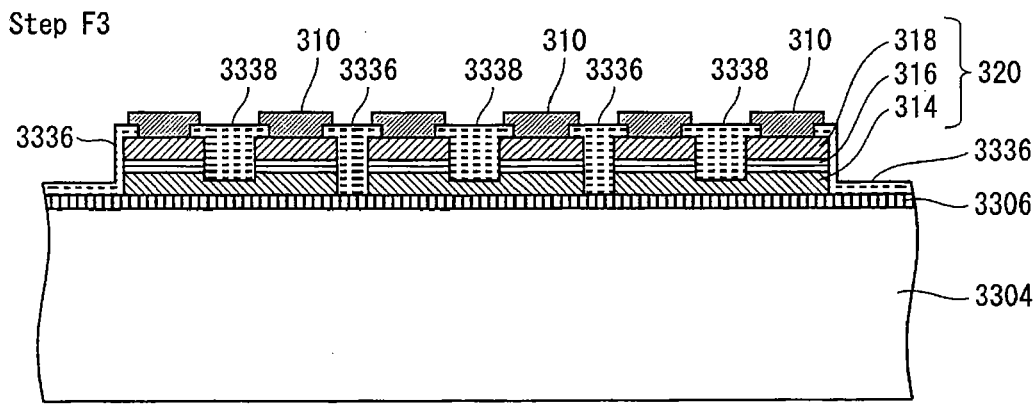

FIG. 26
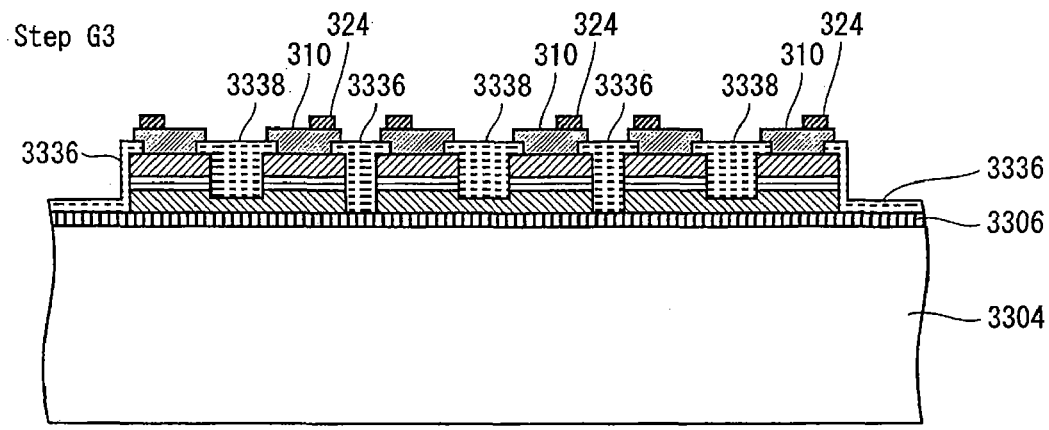
Step G3
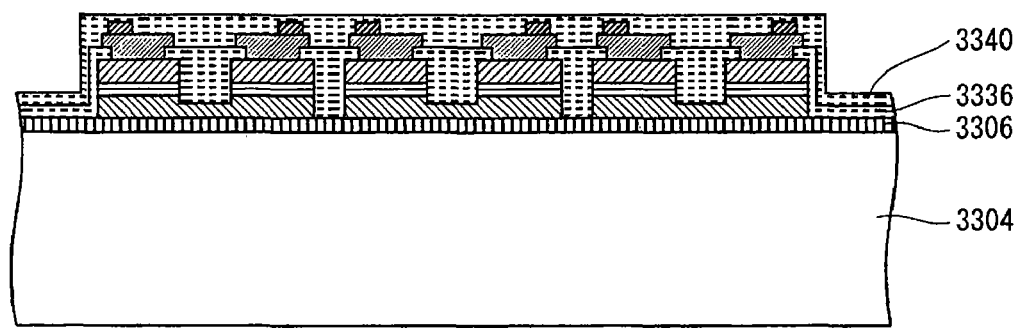
Step H3
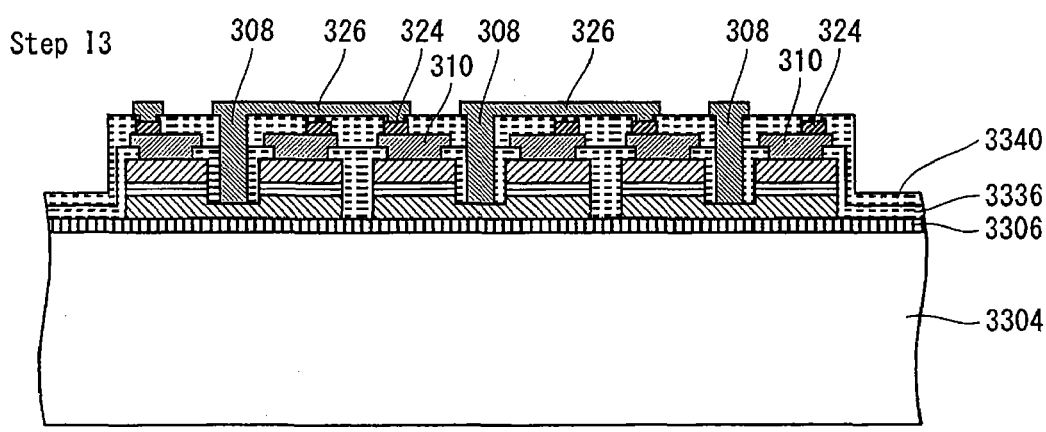
Step I3

FIG. 27
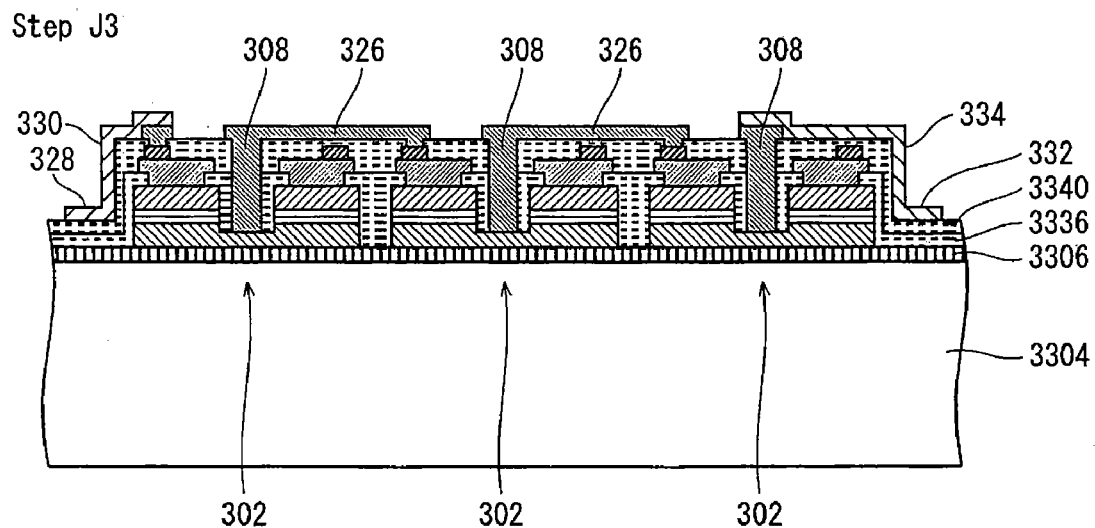
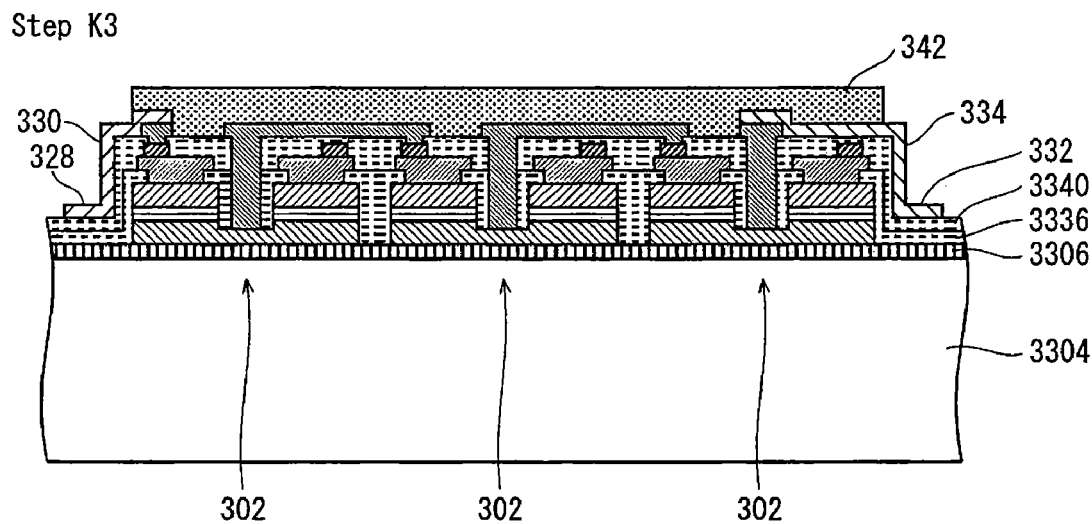
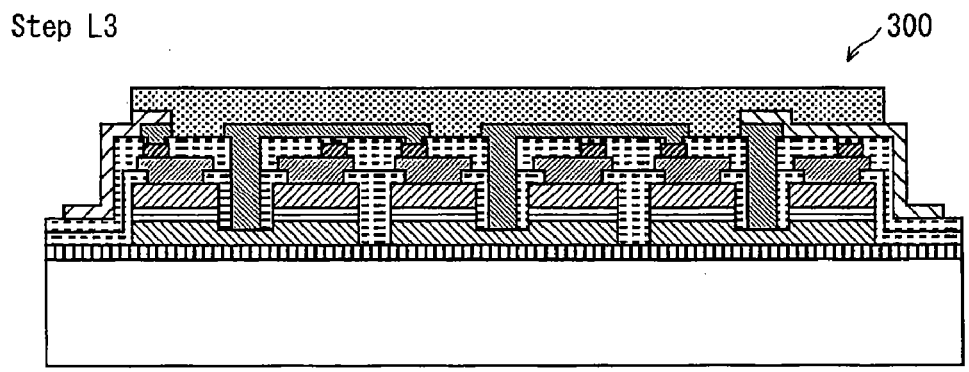

SEMICONDUCTOR LIGHT-EMITTING DEVICE, LIGHT-EMITTING MODULE, AND ILLUMINATION DEVICE

TECHNICAL FIELD

The present invention relates to semiconductor light-emitting devices, light-emitting modules and illumination apparatuses, and particularly relates to a semiconductor light-emitting device that includes a plurality of light-emitting elements.

BACKGROUND ART

A light-emitting diode (LED), which is a type of semiconductor light-emitting element, is smaller and exhibits higher efficiency than other light sources that utilize discharge or radiation. In addition, recent improvements in luminous flux of LEDs have been expanding the range of application thereof, from conventional displaying use to lighting use.

In particular, bulb-type LED lamps that are attachable to sockets for conventional incandescent light bulbs and the likes have been introduced as alternatives to the conventional light bulbs.

Meanwhile, the related supply voltage of a conventional light bulb is generally 100 [V], 24 [V] or 12 [V], whereas the drive voltage of a Single LED is in the range of 3 [V] to 4 [V]. Thus, generally, a required number of LED chips are serially connected on a printed wiring board to suit the supply voltage (see Patent Literature 1).

For the use of an LED lamp as an alternative to a light bulb, it is necessary to arrange a required number of LEDs in a limited area. However, there is a limit to how much the intervals between the LED chips on the printed wiring board can be reduced.

In view of this, a semiconductor light-emitting device including a plurality of LED elements serially connected within each single chip by thin-film wiring has been developed (See Patent Literature 2). According to this technology, the LED elements, manufactured at the same time in the semiconductor manufacturing process, are electrically connected by thin-film wiring in the same semiconductor manufacturing process.

The following shows an overview of the semiconductor light-emitting device disclosed in Patent Literature 2. First, a semiconductor multilayer film, which includes a first conductive layer of n-type, a light-emitting layer and a second conductive layer of p-type formed over a SiC substrate in the stated order, is partitioned by etching into a plurality of light-emitting elements in a matrix, each having a square shape in plan view. A small square portion in plan view is removed by etching from one of the four corners of each light-emitting element so that a square portion of the first conductive layer is exposed. An n-electrode is formed on the exposed square portion of the first conductive layer. Also, a p-electrode is formed on the second conductive layer which remains in a hook-like shape. Then, an insulating film is formed between the p-electrode of a light-emitting element and the n-electrode of another light-emitting element adjacent thereto, and the p-electrode and the n-electrode are electrically connected with each other via thin-film wiring running on the insulating film. After that, the SiC substrate is divided by dicing into a plurality of separate chips, each having a plurality of light-emitting elements. Thus, semiconductor light-emitting device chips, each having a plurality of light-emitting elements, are manufactured.

In such a semiconductor light-emitting device, the distance between adjacent light-emitting elements is equal to the minimum width of the portion of the semiconductor multilayer film that is removable by etching in the semiconductor manufacturing process. Thus, the light-emitting elements can be integrated in high density.

CITATION LIST

Patent Literatures

[Patent Literature 1] Japanese Patent No. 3989794
[Patent Literature 2] Japanese Patent No. 4160881

SUMMARY OF INVENTION

Technical Problem

In a semiconductor multilayer film, which includes an n-type semiconductor layer contacting an n-electrode, a p-type semiconductor layer contacting a p-electrode, and a light-emitting layer sandwiched between the semiconductor layers, the resistance between the electrodes decreases as the distance between the electrodes decreases, and the resistance increases as the distance increases. Thus, electrical current concentrates in the area where the distance between the electrodes is short, and current density in the light-emitting layer will be ununiform. Consequently, the light emission intensity in the light-emitting layer will be ununiform.

For example, in each light-emitting element of the semiconductor light-emitting device disclosed in Patent Literature 2, stronger light is emitted from the portion adjacent to the two sides of a small squared n-electrode, where the current concentrates in high density.

It is also known that a higher current density leads to a lower luminous efficiency. In the semiconductor light-emitting device disclosed in Patent Literature 2, most of the applied current flows through the portions with the high current density. Thus, the luminous efficiency of the device is low in total.

In view of the problems described above, the first objective of the present invention is to provide an improvement of the semiconductor light-emitting device disclosed in Patent Literature 2, which exhibits more uniform current density in the light-emitting layer in each light-emitting element than Patent Literature 2. The second objective of the present invention is to provide a light-emitting module having such a semiconductor light-emitting device, and an illumination apparatus having the light-emitting module.

Solution to Problem

To achieve the objectives above, one aspect of the present invention is a semiconductor light-emitting device having a substrate on which a semiconductor multilayer film is disposed, the semiconductor multilayer film having a layered structure in which a first conductive layer, a light-emitting layer and a second conductive layer are layered above the substrate from bottom to top in the stated order, and being divided into portions by grooves extending perpendicular to the substrate, each portion having a diode structure and serving as a light-emitting element, each light-emitting element having a hole in a central portion thereof in plan view, the hole penetrating through the second conductive layer and the light-emitting layer and reaching the first conductive layer, and comprising: a first electrode inserted in the hole and having a columnar shape, one end thereof being connected to the first conductive layer at the bottom of the hole, and the other end protruding from an opening of the hole; and a second electrode formed on the second conductive layer and having an annular shape surrounding the opening of the hole.

SUMMARY OF INVENTION

In the semiconductor light-emitting device pertaining to the present invention having the stated structure, the first electrode is connected to the first conductive layer at the bottom of the hole provided in the center portion of the light-emitting element in plan view, and the second electrode is formed on the second conductive layer so as to surround the opening of the hole. Thus, between the first electrode and the second electrode, current flows in all directions from the first electrode in plan view. Therefore, the current flows are more uniform and spread wider in the light-emitting layer than the conventional semiconductor light-emitting device described above. That is, the current density in the light-emitting layer is made uniform as much as possible. This improves the luminous efficiency because the current density of the portion where is likely to have the highest current density is lower than the conventional semiconductor light-emitting device when provided with the same amount of current in total.

BRIEF DESCRIPTION OF DRAWINGS

FIG. 8 is a diagram for explaining a method for manufacturing the LED array chip pertaining to Embodiment 1.

FIG. 9 is a diagram for explaining a method for manufacturing the LED array chip pertaining to Embodiment 1.

FIG. 16 is a diagram for explaining a method for manufacturing the LED array chip pertaining to Embodiment 2.

FIG. 17 is a diagram for explaining a method for manufacturing the LED array chip pertaining to Embodiment 2.

FIG. 18 is a diagram for explaining a method for manufacturing the LED array chip pertaining to Embodiment 2.

FIG. 19 is a diagram for explaining a method for manufacturing the LED array chip pertaining to Embodiment 2.

FIG. 20 is a diagram for explaining a method for manufacturing the LED array chip pertaining to Embodiment 2.

FIG. 24 is a diagram for explaining a method for manufacturing the LED array chip pertaining to Embodiment 3.

FIG. 25 is a diagram for explaining a method for manufacturing the LED array chip pertaining to Embodiment 3.

FIG. 26 is a diagram for explaining a method for manufacturing the LED array chip pertaining to Embodiment 3.

FIG. 27 is a diagram for explaining a method for manufacturing the LED array chip pertaining to Embodiment 3.

DESCRIPTION OF EMBODIMENTS

The following describes embodiments of the present invention with reference to the drawings.

<Embodiment 1>

Structure of LED Array Chip

Figure 1:
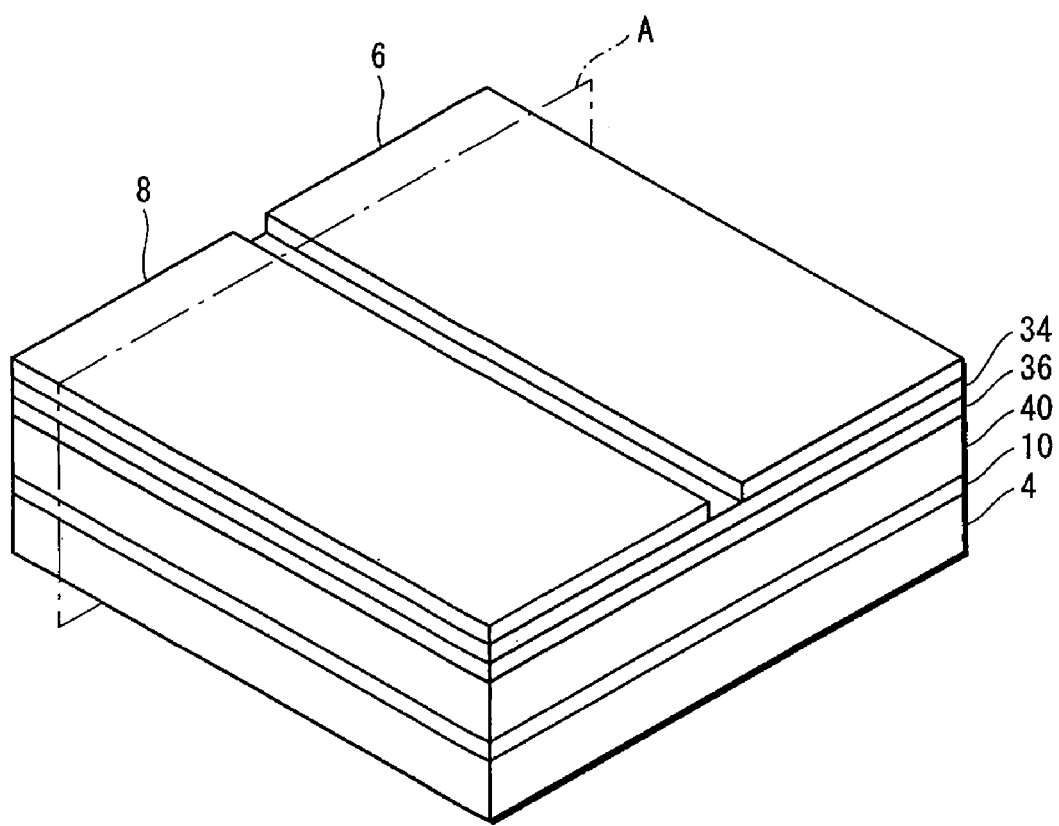
FIG. 1 is a perspective view showing an overall structure of an LED array chip pertaining to Embodiment 1.
Figure 2:
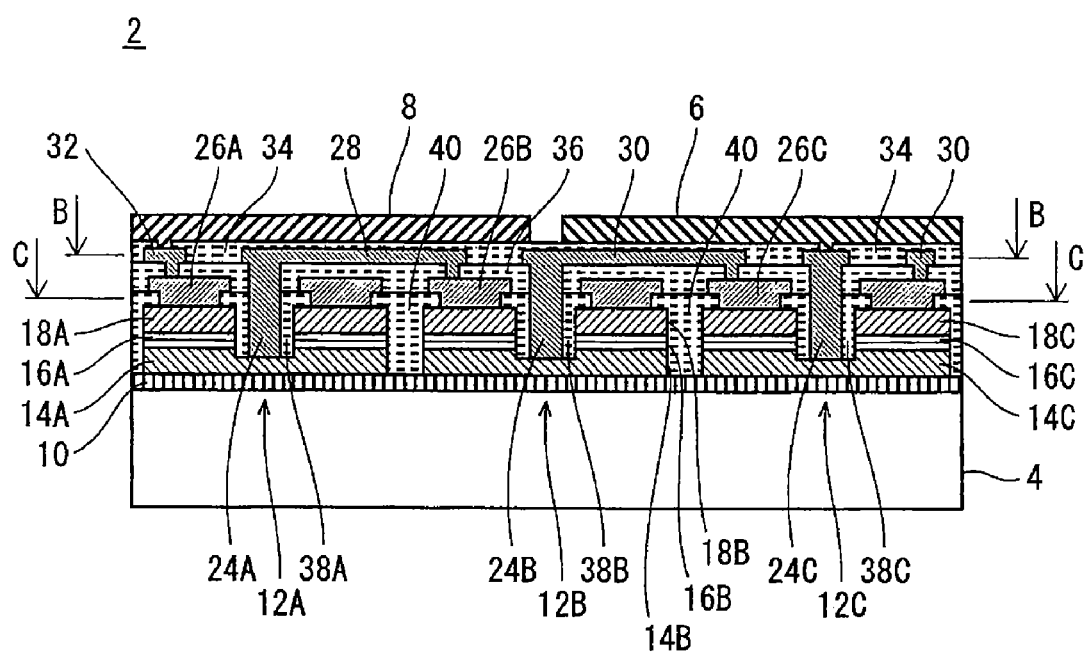
FIG. 2 is a cross-sectional view of the LED array chip pertaining to Embodiment 1 cut along a plane A shown in FIG. 1.

FIG. 1 is a perspective view showing an overall structure of an LED array chip 2 as a semiconductor light-emitting device, and FIG. 2 is a cross-sectional view of the LED array chip 2 cut along the plane A shown in FIG. 1. Note that the scale ratio between the elements is not the same in each of the drawings, including FIG. 1 and FIG. 2.

As shown in FIG. 1, the LED array chip 2 has a structure in which a plurality of LEDs as light-emitting elements (not depicted in FIG. 1) are disposed between an SiC substrate 4 or the like (hereinafter simply referred to as "SiC substrate 4") and first and second power supply terminals 6 and 8. In this example, nine LEDs are disposed on the SiC substrate 4, as described below. In FIG. 1, note that a high-resistance layer 10 and insulating films (i.e. layers) 34, 36 and 40 are shown on the side surfaces of the LED array chip 2 sandwiched between the SiC substrate 4 and the first and second power supply terminals 6 and 8. The insulating films 34, 36 and 40 will be described later. The high-resistance layer 10 is made of AlGaN, for example. The high-resistance layer 10 is not essential when the SiC substrate 4 is with high resistivity (e.g. greater than 1E5 [Ω·cm]. The same applies to other substrates), or when a substrate made of an insulating material, such as a sapphire substrate, is used instead of the SiC substrate 4. When the LED array chip 2 is configured to extract light from the direction of the substrate, a substrate made of a translucent material, such as a GaN substrate, an AlN substrate and a ZnO substrate, may be used. Alternatively, a substrate having a wavelength conversion function, such as YAG:Ce, may be used.

The substrate measures 1 mm on each side, and each light-emitting element measures 300 μm on each side.

In FIG. 2, three of the nine LEDs, namely an LED 12A, an LED 12B and an LED 12C which are serially connected, are shown on the cross section. The nine LEDs, including the LED 12A, the LED 12B and the LED 12C, each basically have the same structure. Thus, the same reference number is given to their respective components. When it is necessary to distinguish one LED from another, an alphabet (A, B, C, . . . , I) follows the reference number.

The following explains the structure of the LED(s) 12, taking the LED 12B as a representative.

Figure 3:
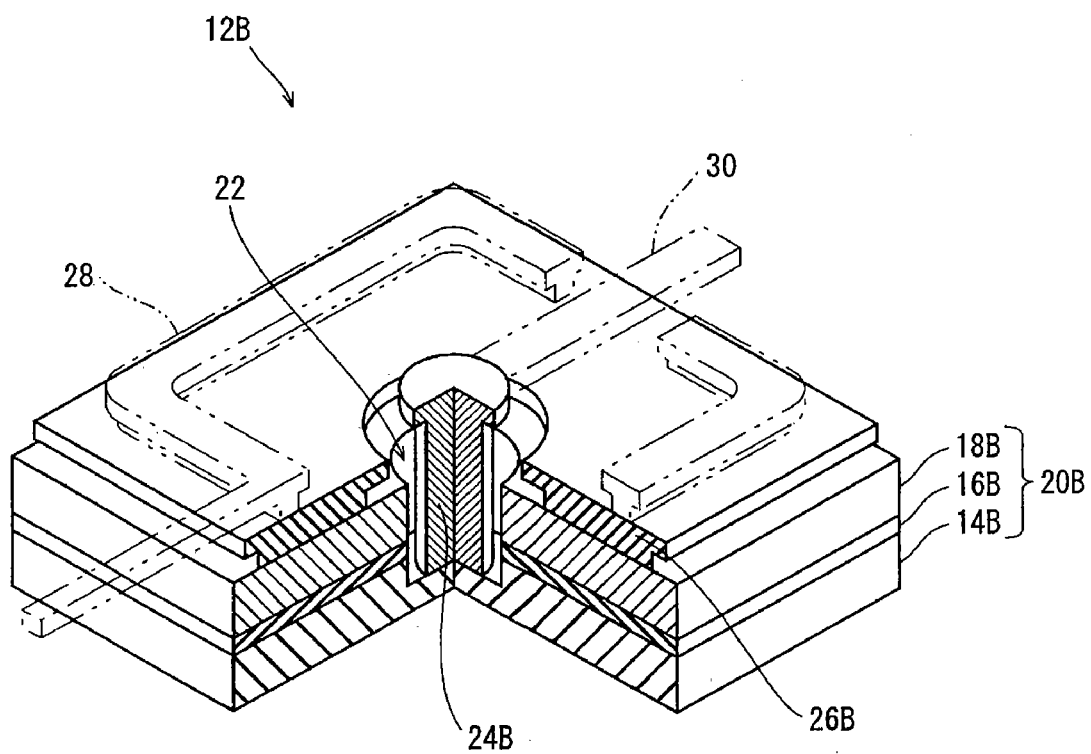
FIG. 3 is a perspective cross-sectional view showing an LED included in the LED array chip pertaining to Embodiment 1.

FIG. 3 shows a perspective cross-sectional view of the LED 12B.

The LED 12B is composed of a semiconductor multilayer film 20B that has a diode structure and includes: an n-type GaN semiconductor layer (hereinafter, "n-GaN layer") 14B, as a first conductive layer; an InGaN quantum well layer (hereinafter, "light-emitting layer") 16B, as a light-emitting layer; and a p-type GaN semiconductor layer (hereinafter, "p-GaN layer") 18B, as a second conductive layer. These layers are formed on the SiC substrate 4 (FIG. 2) in the stated order. The thickness of the n-GaN layer is in the range from 3 [μm] to 10 [μm]. The thickness of the p-GaN layer is in the range from 100 [nm] to 300 [nm]. The thickness of the light-emitting layer is in the range from 10 [nm] to 30 [nm]. Each of the n-GaN layer, the p-GaN layer and the light-emitting layer is composed of a plurality of layers each being different in composition and doping concentration.

The semiconductor multilayer film 20B as a whole has a plate-like rectangular shape. In plan view, a hole 22 is provided in the central portion thereof. The hole 22 penetrates through the p-GaN layer 18B and the light-emitting layer 16B, and reaches the n-GaN layer 14B. That is, the bottom of the hole 22 is composed of a portion of the n-GaN layer 14B.

The LED 12B has an n-electrode 24B having a columnar shape (a cylindrical shape in this example), as a first electrode. One end of the n-electrode 24B is connected to the n-GaN layer 14B at the bottom of the hole 22. The other end of the n-electrode 24B projects from the opening of the hole 22.

The LED 12B also has a p-electrode 26B as a second electrode on one side of the p-GaN layer 18 where the opening of the hole 22 is provided (i.e. the side opposite to the light-emitting layer 16). The p-electrode 26B has an annular shape surrounding the opening of the hole 22.

When the LED 12B having the stated structure is supplied with power from the p-electrode 26B and the n-electrode 24B, the light-emitting layer 16B generates blue light.

Here, between the p-electrode 26B and the n-electrode 24B, the current flows spread equally in all directions (i.e. 360°) from the n-electrode 24 in plan view. Thus, compared with the conventional semiconductor light-emitting device described above, the current flows are more uniform and spread wider in the light-emitting layer. That is, the in-plane current density in the light-emitting layer is made uniform, and thus the current density in the high current density portions of the light-emitting layer, which affects the luminous efficiency, is lower than the conventional semiconductor light-emitting device, when supplied with the same amount of power. This improves the luminous efficiency.

In conventional lamps, particularly in lamps for lighting purpose which require high output, LED chips having a large light-emitting layer that measures 1 mm or greater on each side are used. Here, 1 mm is the substrate size of the LED array chip 2. In the LED array chip 2, in contrast, the semiconductor multilayer film is divided and thus the area of the light-emitting layer of each light-emitting element is reduced. Consequently, the luminous efficiency of each light-emitting element is improved, and thus the luminous efficiency of the LED array chip 2 is improved in total. Moreover, the stated structures of both electrodes even further improve the luminous efficiency.

This realizes high-efficiency lamps even with a large chip for lighting purpose. At the same time, the serial connection of a required number of light-emitting elements realizes an LED (array) chip with an operating voltage that is close to the source voltage.

The LED 12B is serially connected to the adjacent LEDs, 12A and 12C, via wires 28 and 30 made from a metal thin film (e.g. V/Al/Ti/Ni/Au film).

That is, as shown in FIG. 2, the p-electrode 26B of the LED 12B and the n-electrode 24A of the LED 12A are connected via the wire 28, and the n-electrode 24B of the LED 12B and the p-electrode 26C of the LED 12C are connected via the wire 30.

The p-electrode 26A of the LED 12A, which is the high-potential end of the serially connected LEDs 12A, 12B and 12C, is connected to the second power supply terminal 8 via the wire 32. The n-electrode 24C of the LED 12C, which is the low-potential end, is directly connected to the first power supply terminal 6.

Note that the material of the wires 28 and 30 is not limited to metal. Alternatively, a translucent conductive material, such as ITO and IZO may be used. When a translucent conductive material is used, the effect of light absorption by the thin-film wiring can be lower than when a metal material used, and thus the light extraction efficiency can be improved.

As shown in FIG. 1, the first power supply terminal 6 and the second power supply terminal 8 are formed with a narrow gap therebetween. The width of the gap is approximately in the range from 100 [μm] to 300 [μm]. To increase the heat radiation from the LED array chip 2 during the operation (i.e. lighting), it is preferable that the total of the areas of the first power supply terminal 6 and the second power supply terminal 8 is as large as possible. In view of this, the first power supply terminal 6 and the second power supply terminal 8 of Embodiment 1 cover the whole area of the main surface of the SiC substrate 4 in plan view, with the minimum gap for insulation between the power supply terminals.

Again, in FIG. 2, the first power supply terminal 6 and the second power supply terminal 8 are insulated from the wires 28, 30 and 32, with the insulating film 34, and the wires 28, 30 and 32 are insulated from the p-electrodes 26, with the insulating film 36. Each n-electrode 24 is insulated from its corresponding light-emitting layer 16 and p-GaN layer 18, with the insulating film 38. Each LED 12 is insulated from an adjacent LED, with the insulating film 40. The insulating films 34, 36, 38 and 40 are made of a translucent material such as silicon nitride, silicon oxide, titanium oxide and titanium nitride.

Figure 4:
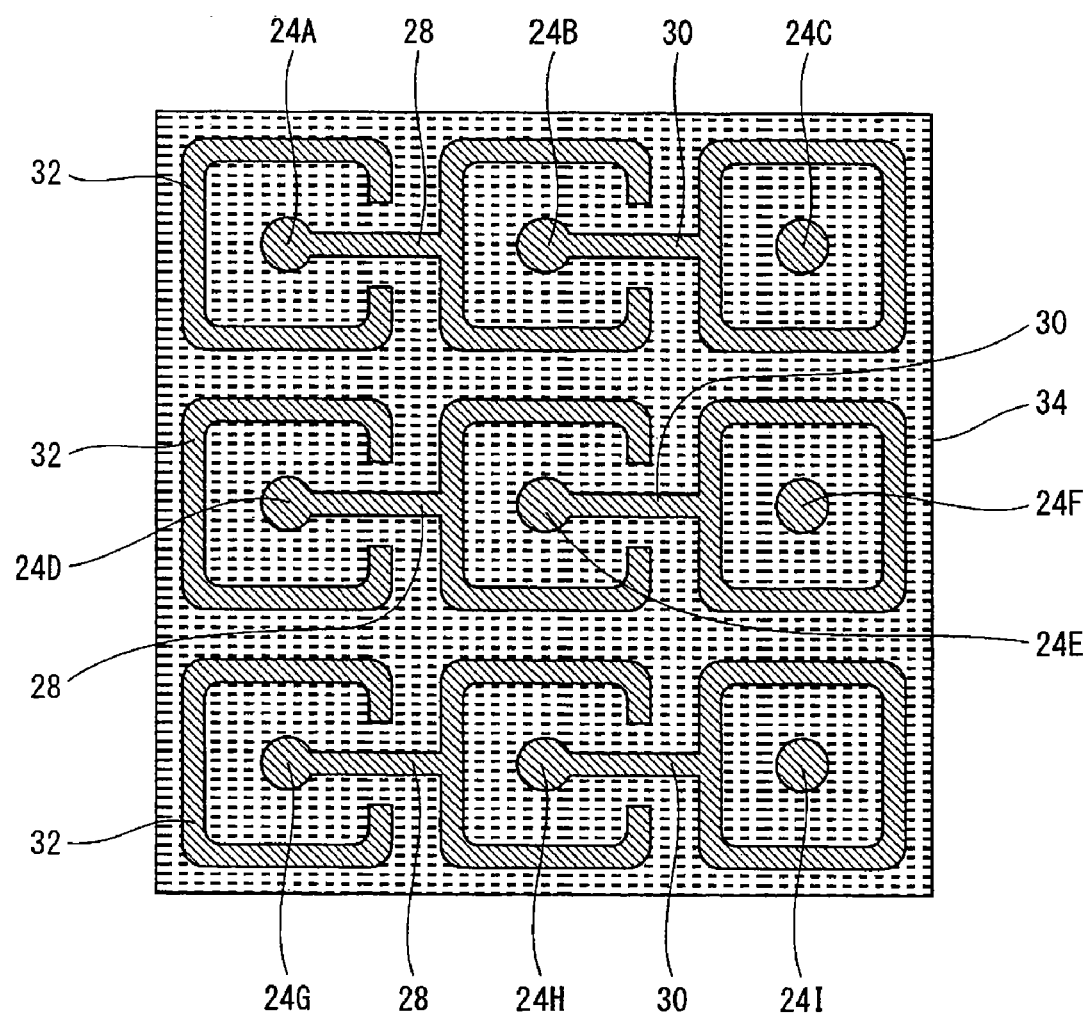
FIG. 4 is a cross-sectional view of the LED array chip pertaining to Embodiment 1 cut along a line B-B shown in FIG. 2.

To clearly show the pattern of the wire 28, 30 and 32, FIG. 4 gives a cross-sectional view of the LED array chip 2, cut along the line B-B in FIG. 2.

The wire 32 is arranged to surround the n-electrode 24, and serves as an auxiliary electrode for uniformly applying current to the light-emitting layer from all directions via the p-electrode 26. The resistance of the wire 32 is lower than the p-electrode. Thus, for uniform application of current to the light-emitting layer, the light-emitting layer is supplied with current from the wire 32 as an auxiliary electrode which is arranged with a distance from the n-electrode. The resistance changes according to the distance between the n-electrode and the wire 32 as an auxiliary electrode. Thus, the wire 32 as an auxiliary electrode in this embodiment has an annular shape so that the distance from the n-electrode is constant at any point, which reduces the resistance. This structure achieves the same effect in Embodiments 2 and 3 described below.

FIG. 4 shows the n-electrodes 24A, 24B and 24C of the LEDs 12A, 12B and 12C described above and the wires 28, 30 and 32. The LED array chip 2 is provided with LEDs 12D, 12E, 12F, 12G, 12H and 12I in addition to the three LEDs mentioned above. Thus, FIG. 4 also shows their respective n-electrodes 24D, 24E, 24F, 24G, 24H and 24I.

Figure 5A:
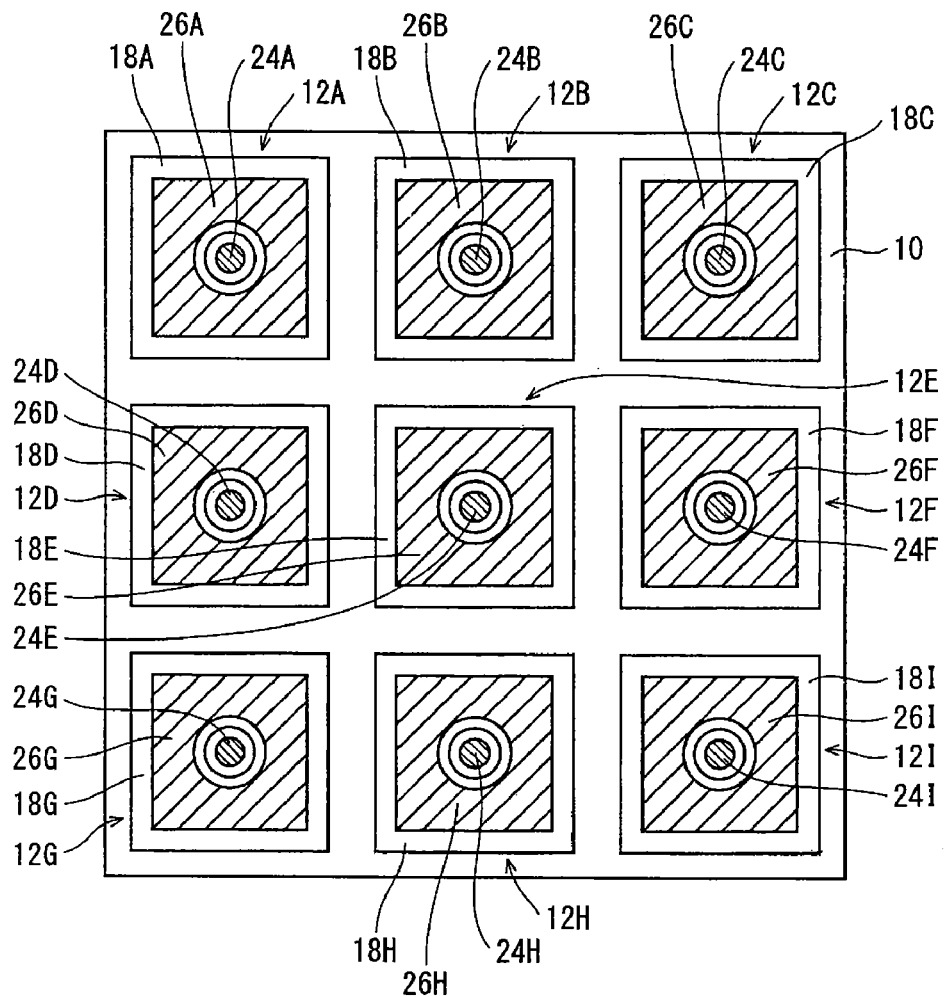
FIG. 5A is a cross-sectional view of the LED array chip pertaining to Embodiment 1 cut along a line C-C shown in FIG. 2.

Next, a cross-sectional view of the LED array chip 2 cut along the line C-C in FIG. 2 is shown in FIG. 5A. Note that the insulating films 34, 36, 38 and 40 (FIG. 2) are omitted in FIG. 5A.

As shown in FIG. 5A, the nine LEDs, namely LEDs 12A, 12B, 12C, 12D, 12E, 12F, 12G, 12H and 12I, are disposed on the high-resistance layer 10 in matrix having three rows and three columns. Among the nine LEDs, the LEDs 12A, 12B and 12C are serially connected via the wires 28 and 30 as described above. Also, the LEDs 12D, 12E and 12F are serially connected via similar wires 28 and 30 (FIG. 4), and the LEDs 12G, 12H and 12I are serially connected via similar wires 28 and 30 (FIG. 4).

The p-electrode 26D of the LED 12D and the p-electrode 26G of the LED 12G are connected to the second power supply terminal 8 via their corresponding wires 32 (FIG. 4). Furthermore, the n-electrode 24F of the LED 12F and the n-electrode 24I of the LED 12I are directly connected to the first power supply terminal 6 as with the LED 12C.

Consequently, the nine LEDs 12A, 12B, 12C, 12D, 12E, 12F, 12G, 12H and 12I are connected in a three-series three-parallel arrangement, in which each set of three LEDs, namely the set of LEDs 12A, 12B and 12C, the set of LEDs 12D, 12E and 12F, and the set of LEDs 12G, 12H and 12I, is serially connected, and these three sets of serially-connected LEDs are parallely connected.

Method for Manufacturing LED Array Chip

Next, a description is given to a method for manufacturing the LED array chip 2 having the stated structure, with reference to FIGS. 6 through 9. Note that the materials of the components of the LED array chip 2 in FIGS. 6 through 9 are given reference numbers in the 100s, and in each of the reference numbers, the last two digits show the reference number given to the corresponding component of the LED array chip 2.

First, the semiconductor multilayer film 120 is formed by sequentially forming the high-resistance layer 110, the n-GaN layer 114, the light-emitting layer 116 and the p-GaN layer 118 over the SiC substrate 104, for example, in the stated order by MOCVD (Metal Organic Chemical Vapor Deposition) [Step A1].

Next, grooves 1000 are formed in the semiconductor multilayer film 120 in vertical and horizontal directions [Step B1], and thus the semiconductor multilayer film 120 is divided into portions 112 corresponding to the LEDs 12. The width of each groove is in the range from 3 [μm] to 10 [μm].

Each groove 1000 is filled with silicon nitride to form an insulating film 140 [Step C1]. The thickness of each insulating film is in the range from 300 [nm] to 1000 [nm].

Figure 7:
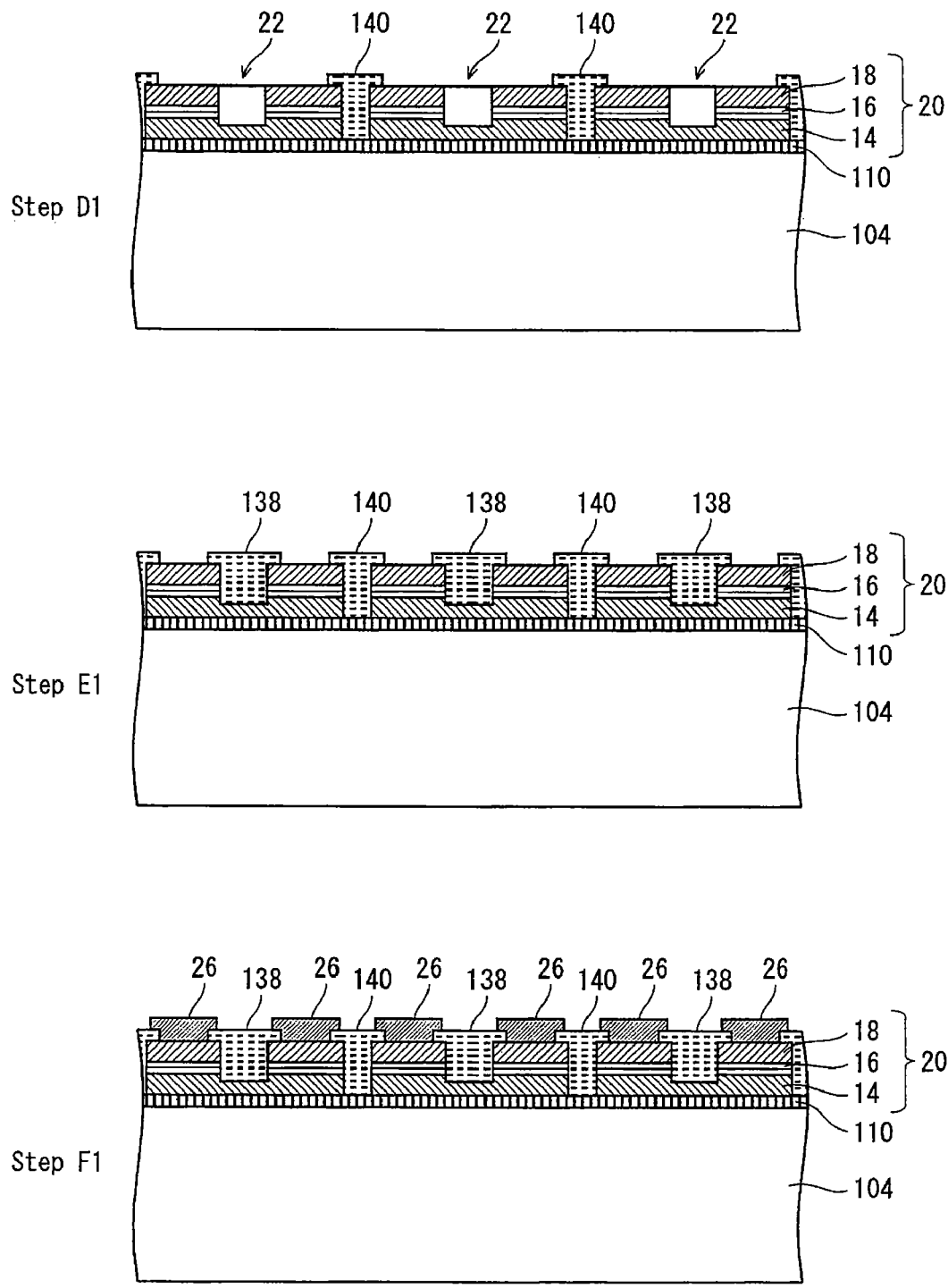
FIG. 7 is a diagram for explaining a method for manufacturing the LED array chip pertaining to Embodiment 1.

Next, as shown in FIG. 7, a hole 22 is provided by etching, in the center of each of the portions 112 which are to serve as the LEDs 12 [Step D1]. The diameter of each hole is in the range from 20 [μm] to 100 [μm]. Thus, the semiconductor multilayer film 20 including the n-GaN layer 14, the light-emitting layer 16 and the p-GaN layer 18 is formed.

Each hole 22 is filled with an insulating material to form an insulating column 138, which will constitute the insulating film 38 [Step E1].

A Rh/Pt/Au film is formed on the exposed surface of the p-GaN layer 18, and thus the p-electrodes 26 are formed [Step F1]. To efficiently extract, from the light emission surface, the light traveling from the light-emitting layer 16 toward the opposite to the light emission surface, the p-electrodes may be made of a high reflective metal, such as Rh, Al, Ag and Pt.

Next, as shown in FIG. 8, an insulating film 136 covering all over the top surfaces of the p-electrodes 26 and the insulating columns 138 are formed [Step G1].

Next, to form the n-electrodes 24 and the wires 30, a hole (not depicted) is provided in predetermined points in the insulating film 136 and the insulating columns 138 by etching, and then a V/Al/Ti/Ni/Au film is formed on a predetermined area. Thus, the p-electrodes 26 and the wires 30 are formed [Step H1].

An insulating film 134 is formed to cover all over the top surfaces of the p-electrodes 26, the top surface of the wire 30, and the exposed surface of the insulating film 136 [Step I1].

Next, as shown in FIG. 9, after portions of the insulating film 134 are removed by etching (not depicted), a Ti/Ni/Ti/Ni/Au film is formed on a predetermined area, and thus a first power supply terminal 106 and a second power supply terminal 108 are formed [Step J1].

Then, after adjusting the thickness of the SiC substrate 104 by grinding (not depicted), the SiC substrate 104 is divided into separate LED array chips by dicing. Thus, the LED array chip 2 (FIG. 1, FIG. 2) is completed [Step K1].

Light-emitting Module

Figure 10A:
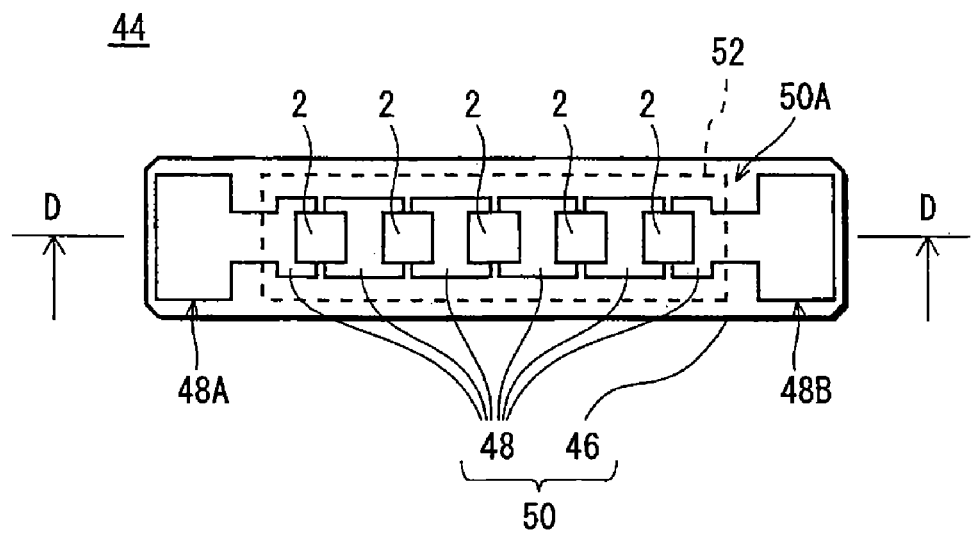
FIG. 10A is a plan view of a white LED module having the LED array chip.
Figure 10B:
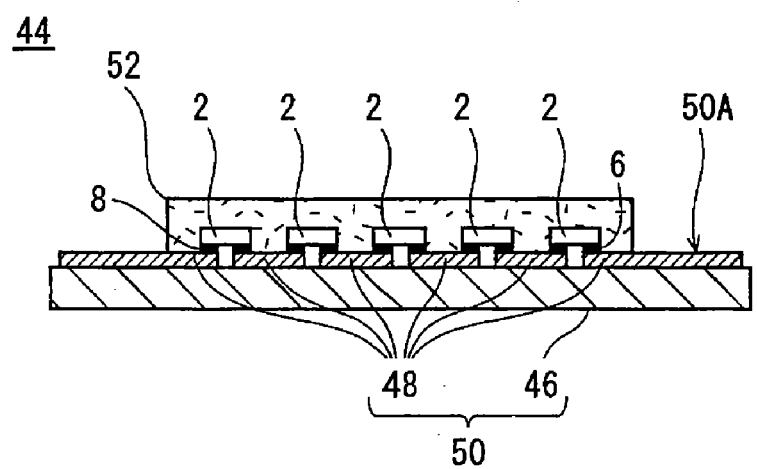
FIG. 10B is a cross-sectional view of the white LED module cut along a line D-D shown in FIG. 10A.

As an example light-emitting module, a white LED module 44 which has a plurality of LED array chips 2 (six chips in this example) is shown in FIG. 10. FIG. 10A is a plan view of the white LED module 44, and FIG. 10B is a cross-sectional view of the white LED module 44 cut along the line D-D shown in FIG. 10A.

As shown in FIG. 10A and FIG. 10B, the white LED module 44 has a printed wiring board 50 that is composed of an insulating substrate 46, on the surface of which a wiring pattern 48 as a conductor pattern is formed. The insulating substrate 46 is made of a ceramic material, a glass material or a single-crystal material. Alternatively, the insulating substrate 46 may be made of sintered aluminum nitride, sintered aluminum oxide, or other insulative sintered metal. The materials mentioned above are hard, brittle, and highly thermal conductive materials.

On predetermined mounting areas on a surface 50A of the printed wiring board 50 as the first main surface, the LED array chips 2 are mounted by flip chip attach. The six LED array chips 2 are serially connected via the wiring pattern 48.

A phosphor film 52, which is a translucent member, is formed to cover the mounted six LED array chips 2. The phosphor film 52 is made of, for example, a translucent resin such as silicone in which a yellow-green phosphor powder, a red phosphor powder and the likes are dispersed. Examples of the yellow-green phosphor powder include $(Ba,Sr)_2SiO_4$:$Eu^{2+}$ and $Y_3(Al,Ga)_5O_{12}$:$Ce^{3+}$, and examples of the red phosphor powder include $Sr_2Si_5N_8$:$Eu^2$ and $(Ca,Sr)S$:$Eu^{2+}$. When the LED array chips 2 emit light, part of the blue light emitted from the LED array chip 2 is absorbed by the phosphor film 52, and is thus converted to yellow-green light or red light. The blue light, the yellow-green light and the red light are combined into white light, which is then emitted mainly from the top surface (i.e. the light emission surface) of the phosphor film 52. Instead of the phosphor film made of a resin material in which a phosphor material is dispersed, for example, an inorganic material (e.g. glass material) in which a phosphor material is dispersed, or a ceramic phosphor plate made of YAG:Ce phosphor or the like, may be used.

The wiring pattern 48 has a power supply land power supply land 48A and a power supply land 48B. The power supply land 48A is electrically connected to the second power supply terminal 8 of the LED array chip 2 at the high-potential end of the serially-connected LED array chips 2. The power supply land 48B is electrically connected to the first power supply terminal 6 of the LED array chip 2 at the low-potential end of the serially-connected LED array chips 2.

Next, as another example light-emitting module, a white LED module 54 which has a single LED array chip 2 is shown in FIG. 11. The white LED module 54 is a surface mount device (SMD) type LED module into which the LED array chip 2 is packaged. SMD type LED modules have a structure in which, for example, a semiconductor light-emitting device (i.e. LED array chip) is mounted on a ceramic substrate, and the semiconductor light-emitting device is sealed with a translucent epoxy resin.

Figure 11A:
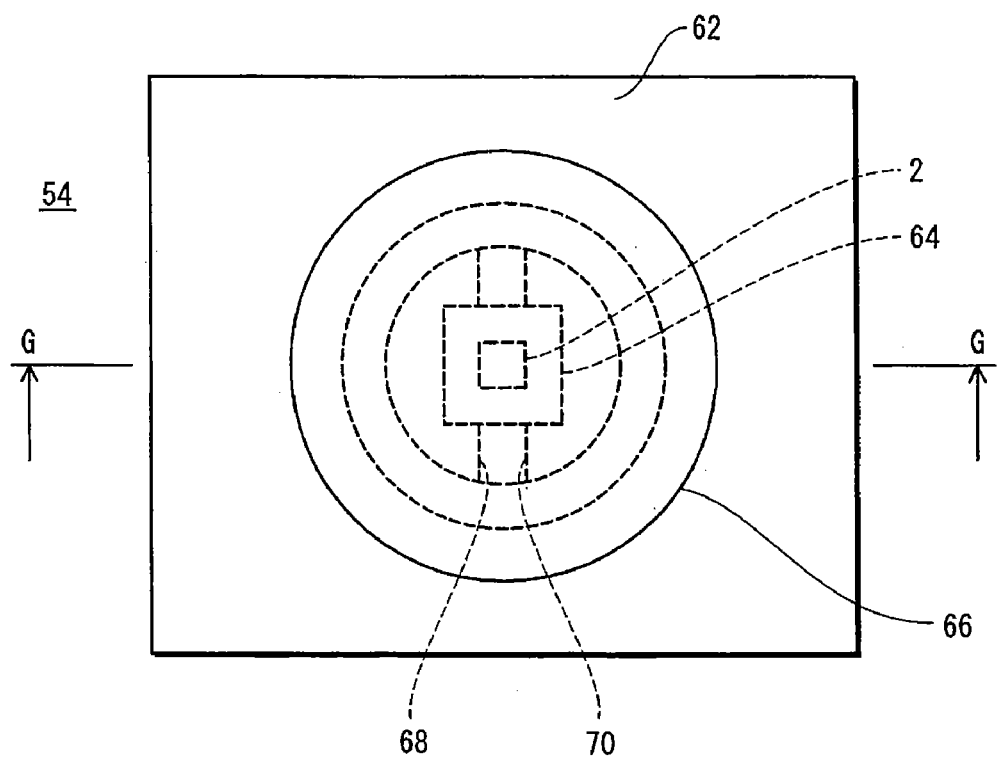
FIG. 11A is a plan view of another white LED module having the LED array chip.
Figure 11B:
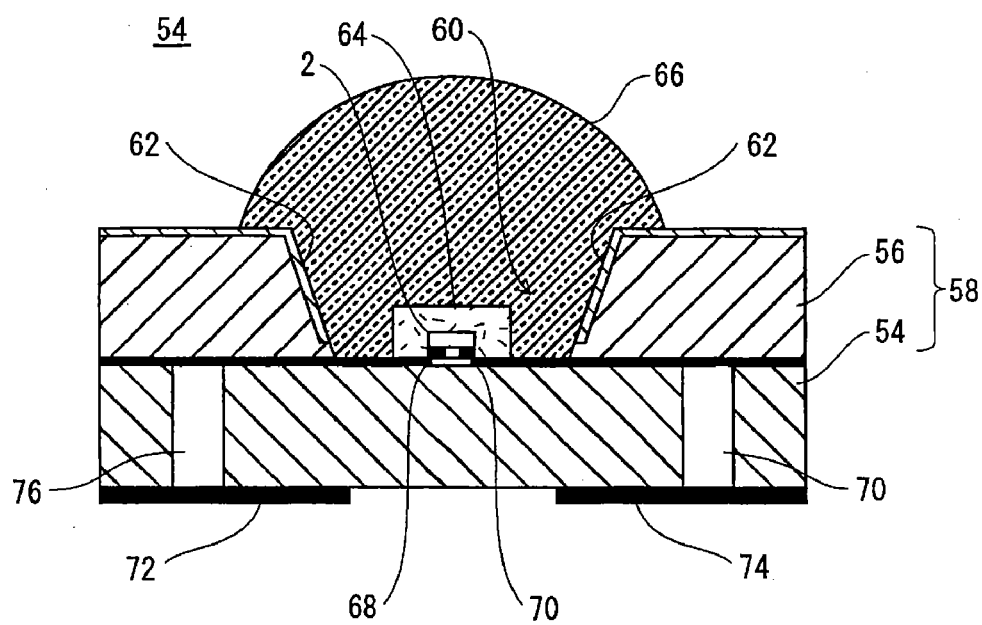
FIG. 11B is a cross-sectional view of the white LED module cut along a line G-G shown in FIG. 11A.

FIG. 11A is a plan view of the white LED module 44, and FIG. 11B is a cross-sectional view of the white LED module 44 cut along the line G-G shown in FIG. 11A.

As shown in FIG. 11B, the white LED module 54 has a ceramic substrate 58 composed of a stack of two ceramic substrates 54 and 56. The ceramic substrate 56, which is the upper layer, is provided with downwardly and internally tapered through holes 60 each for securing a mounting space of the LED array chip 2. In other words, the ceramic substrate 58 has recesses each of which is diametrically larger toward the opening, and each LED array chip 2 is mounted on the bottom of the corresponding recess. Yet, the through holes forming the recesses do not have to be tapered. The through holes may define a bowl-like profile, for example.

An aluminum reflecting film 62 of a substantially uniform thickness is provided to coat the upper surface of the upper ceramic substrate 56 as well as the inner walls of the through holes 60 formed through the ceramic substrate 56. With the provision of the aluminum reflecting film 62, reflectors (reflector holes) are formed. Each through hole 60 is formed (designed) to have such a shape that white light emitted from the lateral sides of the LED array chip 2 is reflected by the aluminum reflecting film 62 on the inner wall of the through hole 60 in a direction substantially perpendicular to the main surface of the ceramic substrate 56.

Also, a phosphor film 64 is formed to cover the LED array chip 2. The phosphor film 64 may be made of a similar material as the white LED module 44 mentioned above. For the formation of the phosphor film 64, potting and electrophoretic deposition may be used.

In addition, lenses 66 are formed by filling each through hole 60 with an epoxy resin.

An anode pad 68 and a cathode pad 70 are formed on the top surface of the ceramic substrate 54, which is the lower layer. The first power supply terminal 6 and the second power supply terminal 8 (FIG. 1, FIG. 2) of the LED array chip 2 are connected to their corresponding pads 68 and 70.

The bottom surface of the ceramic substrate 54 is provided with terminals 72 and 74 of the white LED module 54. The terminal 72 is electrically connected to the anode pad 68 via the through hole 76, and the terminal 74 is electrically connected to the cathode pad 70 via the through hole 78.

When the white LED module 54 having the stated structure is supplied power via the terminal 72 and 74, the LED array chip 2 emits blue light, which passes through the phosphor film 64 and is thus converted into white light, and the white light is emitted via the lens 66.

Illumination Apparatus

Figure 12:
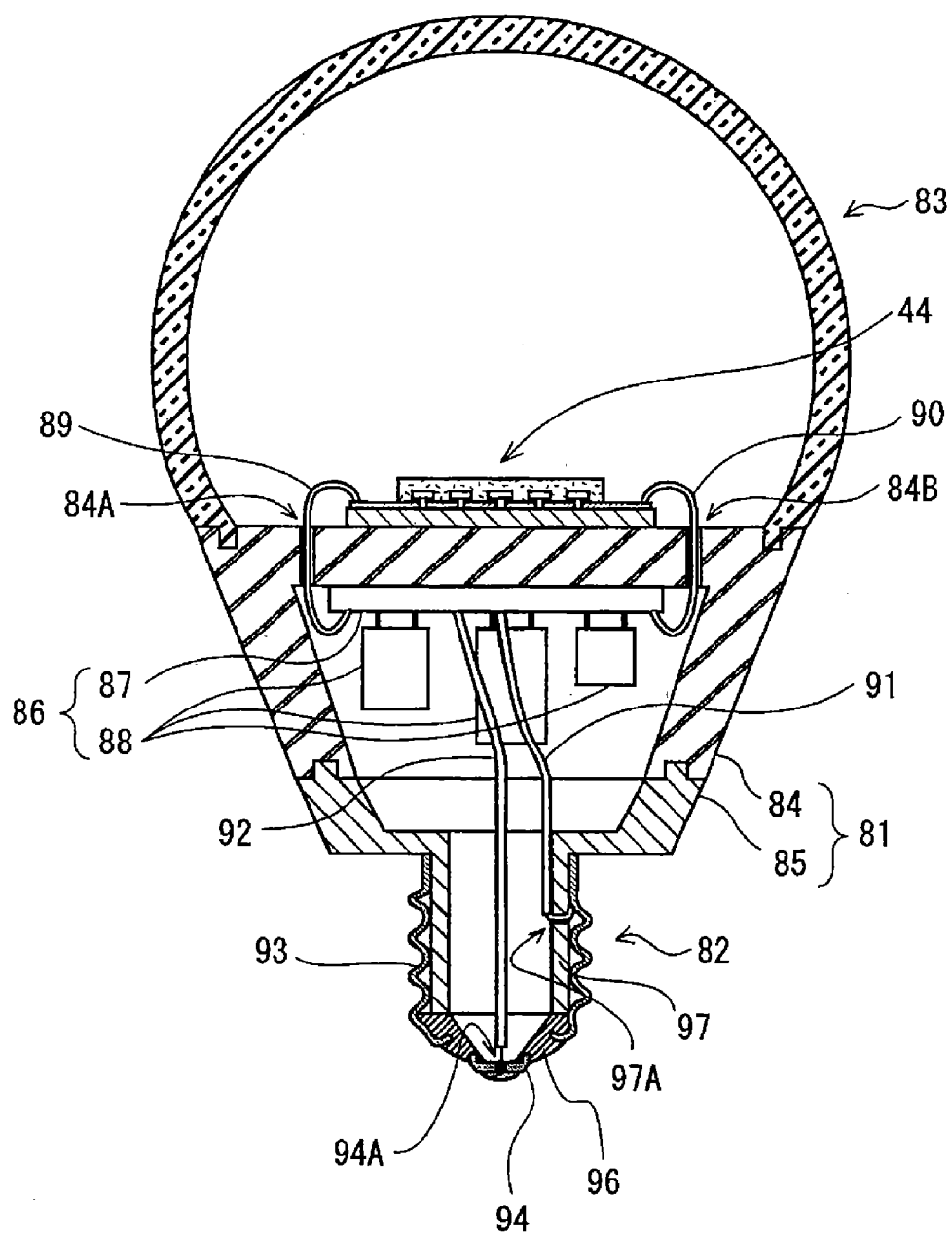
FIG. 12 is a bulb-type LED lamp having the white LED module shown in FIG. 10.

FIG. 12 shows a cross-sectional view of a bulb-type LED lamp 80 (hereinafter, "LED lamp 80") which has a white LED module 44 (FIG. 10), as an example bulb-type illumination apparatus.

As shown in FIG. 12, the LED lamp 80 includes a casing 81, a base 82 integrally connected with the casing 81, and a substantially semispherical shell-shaped cover 83 bonded to the casing 81. The cover 83 is made of a translucent material such as a synthetic resin and a glass.

The casing 81 includes a metal part 84 and an insulating part 85. The metal part 84 is made of aluminum for example, and also serves as a heatsink for radiating heat generated mainly by the LED array chip 2. The insulating part 85 is made of an epoxy resin or another synthetic resin material.

The metal part 84 substantially has a shape of a circular truncated cone that is hollow. The white LED module 44 is bonded to the external surface of the bottom of the metal part 84, with an adhesive agent (not depicted) or the like. Thus, the metal part 84 also serves as a base for mounting the white LED module 44 thereon.

Meanwhile, the metal part 84 houses a lighting circuit unit 86 used for lighting the white LED module 44. The lighting circuit unit 86 includes a second printed wiring board 87, which is connected to the internal surface of the bottom of the metal part 84, and a plurality of electronic parts 88, which are mounted on the second print wring board 87. The electronic parts 88 are electrically connected to the wiring pattern (e.g. lands) of the second printed wiring board 87 by soldering. Also, the electronic parts 88 are electrically connected to each other via the wiring pattern, lead wires soldered to the printed wiring board 87, and the likes. The white LED module 44 and the lighting circuit unit 86 are electrically connected to each other via internal wires 89 and 90 respectively inserted through through holes 84A and 84B provided in the central portion of the bottom of the metal part 84. Note that one ends of the internal wires 89 and 90 closer to the white LED module 44 than the other ends are connected to the power supply land 48A and 48B (FIG. 3) respectively, by soldering.

The lighting circuit unit 86 converts commercial AC power, supplied from the base 82 via a first lead line 91 and a second lead line 92, into power for lighting the white LED module 44, and supplies the white LED module 44 with the converted power. Note that the first lead line 91 and the second lead line 92, as well as the internal wires 89 and 90, are coated wire lines, and the coatings on both ends are partially stripped so that their internal lines are exposed.

The base 82 complies with, for example, the E26 base standards defined in JIS (Japanese Industrial Standards), and is attachable to a socket (not depicted) for common incandescent light bulbs.

The base 82 includes a shell 93, which is also referred to as a cylindrical body, and an eyelet 94 having a circular dish-like shape. The shell 93 and the eyelet 94 are integrated together, with a first insulating part 96 therebetween. The first insulating part 96 is made of a glass material. This integrated body is fit into a second insulating part 97 which extends from the casing 81 and has a cylindrical shape.

The second insulating part 97 is provided with a through hole 97A, and the first lead line 91 extends from the inside of the second insulating part 97 to the outside, via the through hole 97A.

The internal lead of the first lead line 91 at one end thereof is sandwiched between the internal surface of the shell 93 and the external surface of the second insulating part 97. Thus, the first lead line 91 and the shell 93 are electrically connected.

The eyelet 94 has a through hole 94A which is provided in the center thereof. The internal lead of the second lead line 92 extends to the outside through the through hole 94A, and connected to the external surface of the eyelet 94 by soldering.

<Embodiment 2>
Structure of LED Array Chip

Figure 5B:
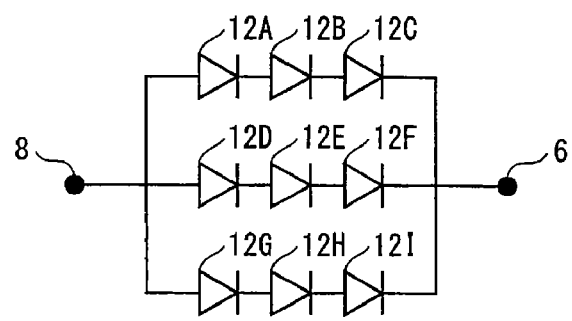
FIG. 5B is a circuit diagram of the LED array chip pertaining to Embodiment 1.
Figure 6:
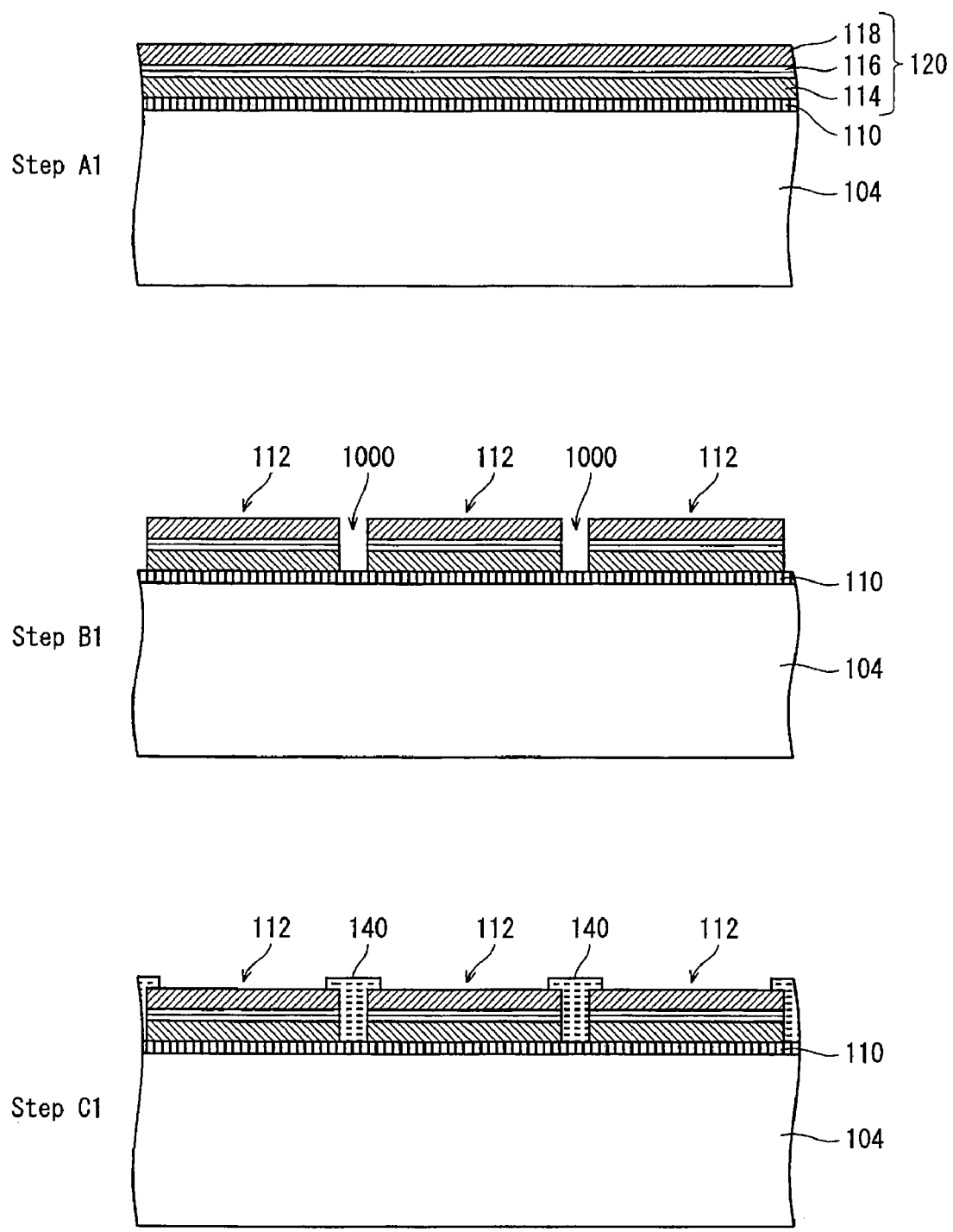
FIG. 6 is a diagram for explaining a method for manufacturing the LED array chip pertaining to Embodiment 1.

The LED array chip 2 pertaining to Embodiment 1 has the nine LEDs, namely LEDs 12A-12I, and these LEDs are connected in a three-series three-parallel arrangement on the SiC substrate 4 (FIG. 5B). Instead of the SiC substrate, a substrate made of a translucent material, such as a GaN substrate, an aluminum nitride substrate and a ZnO substrate, may be used. Alternatively, a substrate having a wavelength conversion function, such as YAG:Ce, may be used.

Figure 13A:
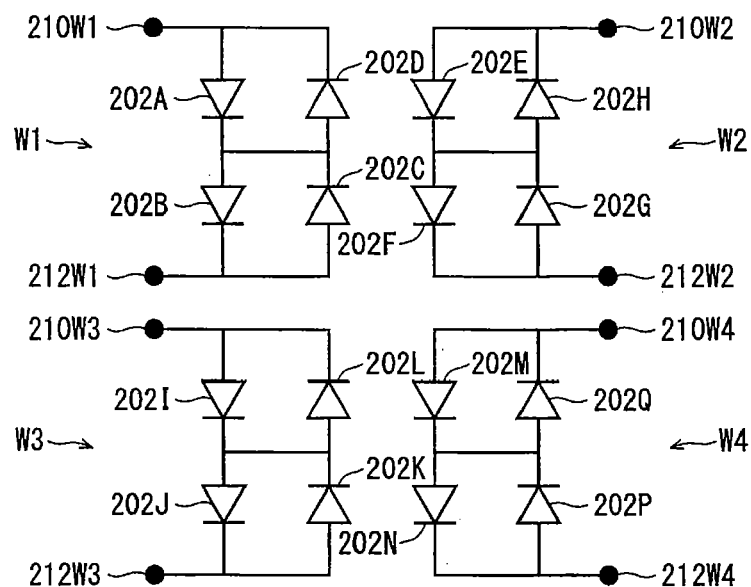
FIG. 13A is a circuit diagram of an LED array chip pertaining to Embodiment 2, and FIG. 13B mainly shows internal wiring in the LED array chip.

In contrast, an LED array chip 200 pertaining to Embodiment 2 has 16 LEDs, namely LEDs 202A-202Q. As shown in FIG. 13A, the LEDs are arranged in groups W1, W2, W3 and W4 each including four LEDs. Each of the groups W1, W2, W3 and W4 are connected in two-series two-parallel arrangement, in which every two LEDs are serially connected, and these two sets of serially-connected LEDs are parallely connected such that they are opposite in polarity.

Each of the LEDs 202A-202Q has the same structure as the LED 12 pertaining to Embodiment 1 shown in FIG. 3. Thus, in the drawings for explaining Embodiment 2, the components of the LEDs 202A-202Q are given the same reference signs (i.e. reference numbers) as the LED 12 pertaining to Embodiment 1.

Each of the LEDs 202A-202Q is disposed on the SiC substrate 204 (FIG. 14) in the same arrangement as shown in FIG. 13A, and they are electrically connected via wires made of metal thin films, as shown in FIG. 13A.

Figure 13B:
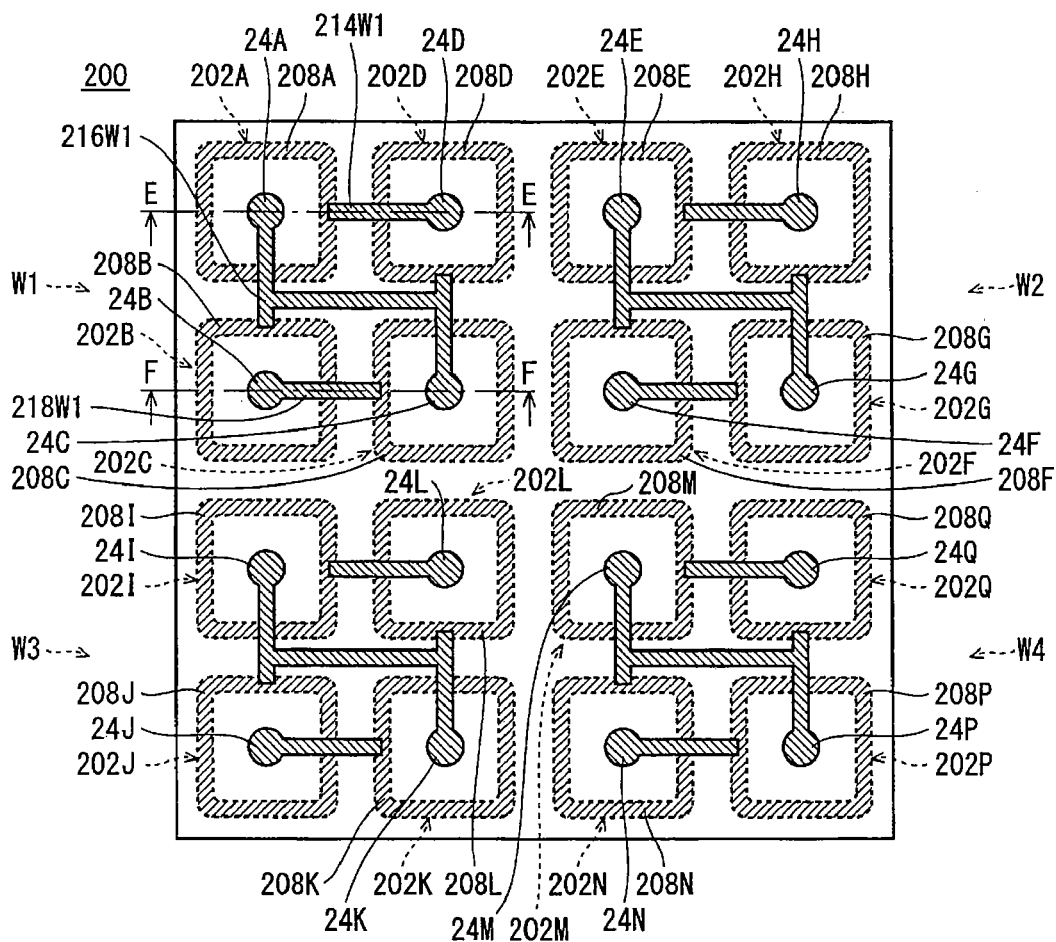

FIG. 13B shows the wiring pattern of the LED array chip 200 in plan view.

Figure 14A:
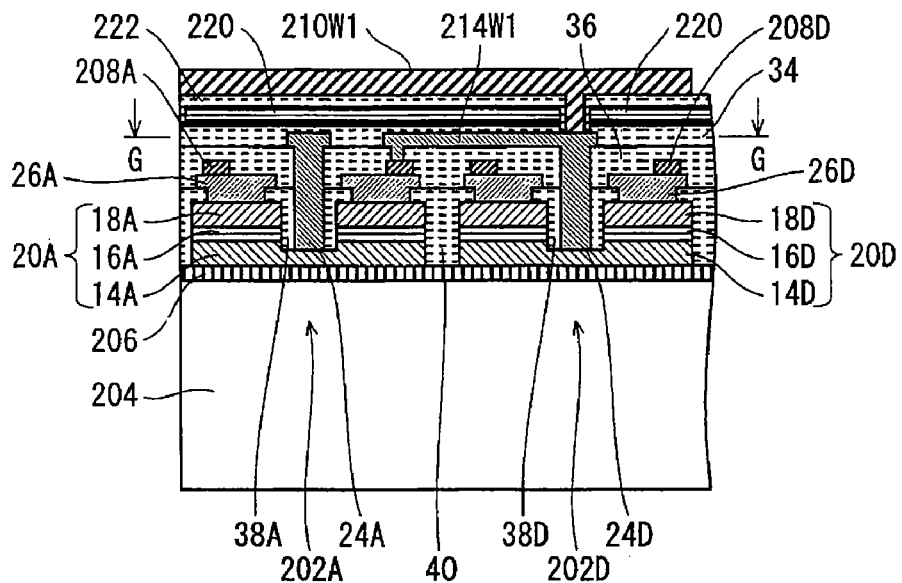
FIG. 14A is a cross-sectional view of the LED array chip pertaining to Embodiment 2 cut along a line corresponding to the line E-E in FIG. 13B.
Figure 14B:
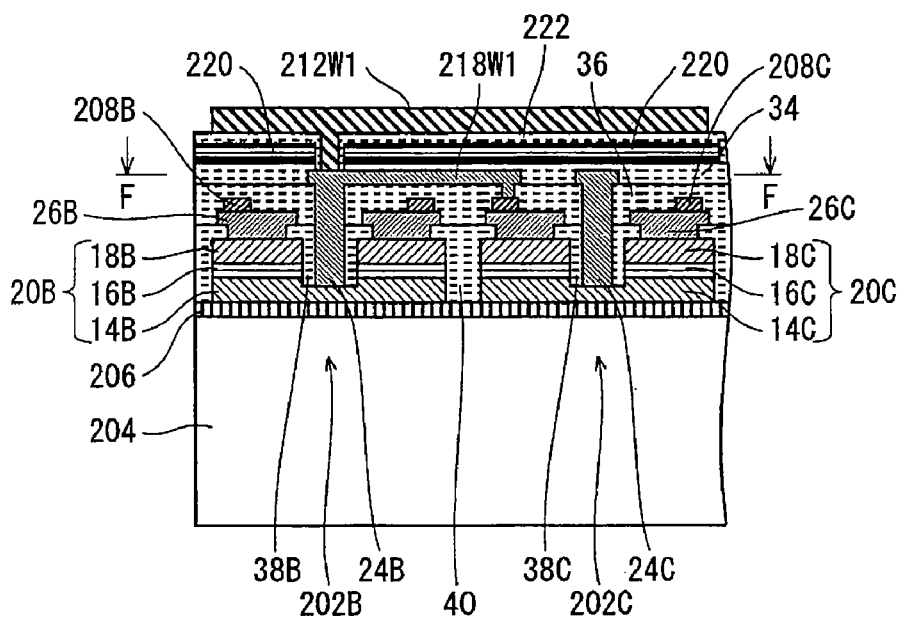
FIG. 14B is a cross-sectional view of the LED array chip pertaining to Embodiment 2, cut along a line corresponding to the line F-F in the same drawing.

FIG. 14A shows a cross-sectional view of the LED array chip 200 cut along a line corresponding to the line E-E in FIG. 13B. FIG. 14B shows a cross-sectional view of the LED array chip 200 cut along a line corresponding to the line F-F in the same drawing. Here, in comparison with FIG. 14A, FIG. 13B shows a cross-sectional view along the line G-G in FIG. 14A.

Figure 15:
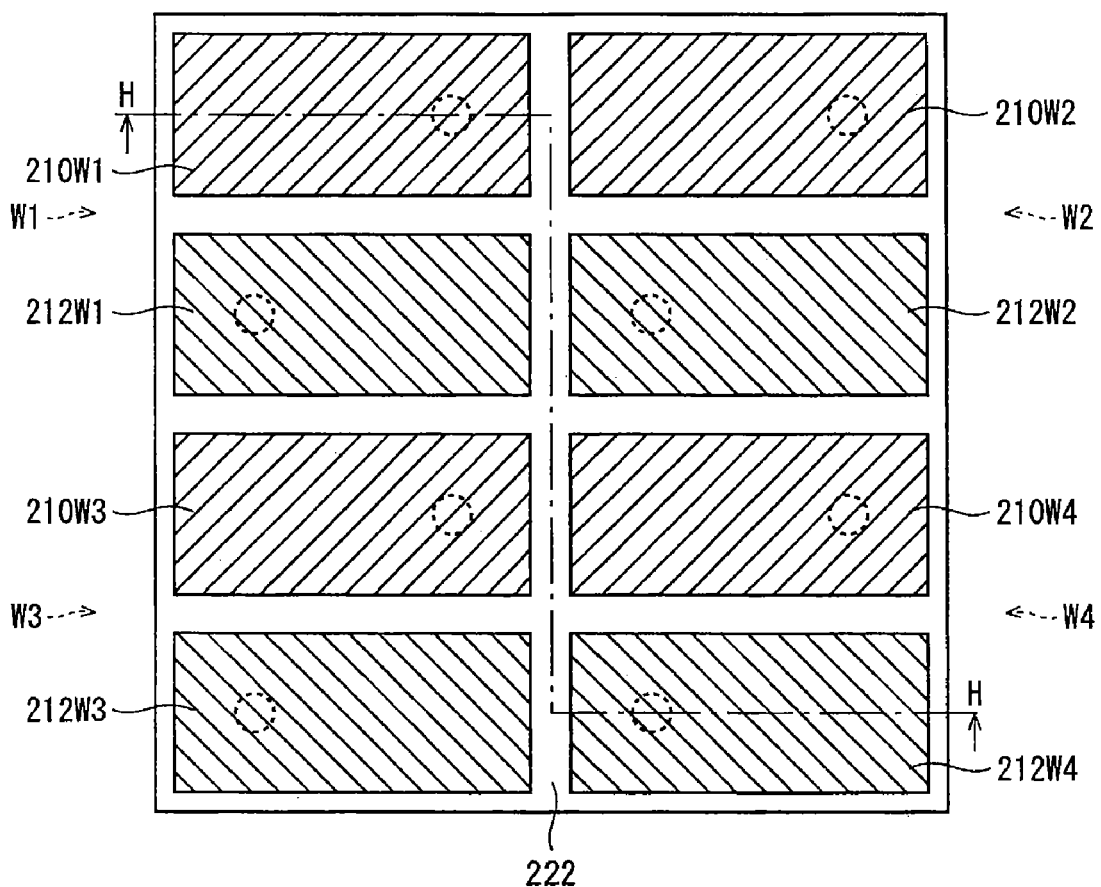
FIG. 15 is a plan view of the LED array chip pertaining to Embodiment 2.

FIG. 15 shows a plan view of the LED array chip 200. As shown in FIG. 15, the LED array chip 200 has pairs of power supply terminals, namely power supply terminals 210W1 and 212W1, 210W2 and 212W2, 210W3 and 212W3 and 210W4 and 212W4. Each pair corresponds to a different one of the groups W1, W2, W3 and W4.

As shown in FIGS. 14A and 14B, the LED array chip 200 includes LEDs 202 formed on a SiC substrate 204 with a high-resistance layer 206 therebetween, as with the LED array chip 2 (FIG. 2). The high-resistance layer is not essential when the SiC substrate 204 is with high resistivity, or when a substrate made of an insulating material, such as a sapphire substrate, is used instead of the SiC substrate 204. As with the LED 2 (FIGS. 2 and 3), each of the LEDs 202 is composed of a semiconductor multilayer film 20 that has a diode structure and includes an n-GaN layer 14, a light-emitting layer 16, and a p-GaN layer 18. These layers are formed on the SiC substrate 204 in the stated order. Each LED 202 also has a p-electrode 26, which is formed along the whole circumference of the top surface of the p-GaN layer 18. Also, an n-electrode 24 having a columnar shape is disposed in a hole provided in the center of the semiconductor multilayer film 20 in plan view. Note that the p-electrode 26 of Embodiment 2 is a translucent electrode composed of ITO, $TiO_2$, $SnO_2$, ZnO, IZO, or the like.

The LEDs 202A-202Q are not seen in FIG. 13B. Thus, their approximate positions are indicated by the dashed arrows. In FIG. 13B, the reference sings 208A-208Q indicate the wires to which the respective p-electrodes 26 of the LEDs 202A-202Q are connected. Each of the wires 208A-208Q has a closed ring-like shape formed along the whole periphery of the corresponding p-electrode 26 which has an annular shape.

The circular portions, seen in the centers of the areas surrounded by the wires 208A-208Q respectively, are end surfaces of the n-electrodes 24A-24Q of the LEDs 202A-202Q.

In each of the groups W1, W2, W3 and W4, the four LEDs 202 are similarly connected via the wires. Thus, the following explains the group W1 as a representative.

As shown in FIG. 14A, the first power supply terminal 210W1 is connected to the n-electrode 24D of the LED 202D.

The n-electrode 24D of the LED 202D and the p-electrode 26A of the LED 202A are electrically connected to each other via the wire 214W1.

As shown in FIG. 13B, the n-electrode 24A of the LED 202A, the p-electrode 26D of the LED 202D (FIG. 14A), the p-electrode 26B of the LED 202B (FIG. 14A), and the n-electrode 24C of the LED 202C are electrically connected to each other via the wire 216W1.

As shown in FIG. 14B, the p-electrode 26C of the LED 202C and the n-electrode 24B of the LED 202B are electrically connected via the wire 218W1.

The second power supply terminal 212W1 is connected to the n-electrode 24B of the LED 202B.

As described above, four LEDs 202A-202D in the group W1 are electrically connected via the wires 208A-208D, 214W1, 216W1, and 218W1 in the relation shown in FIG. 13A As with the LED array chip 2 (FIG. 2), the LED array chip 200 may be provided with a translucent insulating film as needed. That is, an insulating film 40 is provided between the LEDs 202, an insulating film 36 is provided on the top surface of the n-electrode 26, and an insulating film 34 is layered on the insulating film 36. In the LED array chip 200, a reflecting film 220 is layered on the insulating film 34. The reflecting film 220 is made of a high reflective material, such as Ag, Al, Pt and Rh.

Also, an insulating film 222 is provided between the reflecting film 220 and the pair of the first power supply terminal 210 and the second power supply terminal 212.

When the LED array chip 200 having the stated structure is supplied with AC power from the power supply terminals 210W1 and 212W1, 210W2 and 212W2, 210W3 and 212W3, and 210W4 and 212W4, the LEDs 202A-202Q emit blue light, and the blue light passes through the SiC substrate 204 and is then emitted. Here, the blue light emitted from the LED 202A-202Q toward the opposite to the SiC substrate 204 is reflected by the reflecting film 220. This improves the light usage efficiency.

Method for Manufacturing LED Array Chip

Next, a description is given to a method for manufacturing the LED array chip 200 having the stated structure, with reference to FIGS. 16 through 20. FIGS. 16 through 20 are cross-sectional views of the LED array chip 200 on the way of the manufacturing process, cut along the line H-H in FIG. 15. Note that the materials of the components of the LED array chip 200 in FIGS. 16 through 20 are given reference numbers in the 2000s, and in each of the reference numbers, the last three digits show the reference number given to the corresponding component of the LED array chip 200.

First, the semiconductor multilayer film 2020 is formed by sequentially forming the high-resistance layer 2206, the n-GaN layer 2014, the light-emitting layer 2016 and the p-GaN layer 2018 over the SiC substrate 2204, for example, in the stated order by MOCVD (Metal Organic Chemical Vapor Deposition) [Step A2].

Next, grooves 1002 are formed in the semiconductor multilayer film 2020 in vertical and horizontal directions [Step B2], and thus the semiconductor multilayer film 2020 is divided into portions 2202 corresponding to the LEDs 202.

Each groove 1002 is filled with silicon nitride to form an insulating film 2040 [Step C2].

Next, as shown in FIG. 17, a hole 22 is provided by etching, in the center of each of the portions 2202 which will constitute the LEDs 202 [Step D2]. Thus, the semiconductor multilayer film 20 including the n-GaN layer 14, the light-emitting layer 16 and the p-GaN layer 18 is formed.

Each hole 22 is filled with an insulating material to form an insulating column 2038, which will constitute the insulating film 38 [Step E2].

An ITO film is formed on the exposed surface of the p-GaN layer 18, and thus the p-electrodes 26 are formed [Step F2].

Next, as shown in FIG. 18, wires 208 are formed for each of the p-electrodes 26 [Step G2].

An insulating film 2036, which covers all over the top surfaces of the wires 208, the p-electrodes 26 and the insulating columns 2038, is formed [Step H2].

Next, to form the n-electrodes 24 and the wires 214 and 218, a hole (not depicted) is provided in predetermined points in the insulating film 2036 and the insulating columns 2038 by etching, and then a V/Al/Ti/Ni/Au film is formed on a predetermined area. Thus, the p-electrodes 26 and the wires 214 and 218 are formed [Step I2].

An insulating film 2034 is formed to cover all over the top surfaces of the p-electrodes 26, the top surface of the wire 214, the top surface of the wire 218, and the exposed surface of the insulating film 2036 [Step J2].

Next, a reflecting film 2220 is formed on a predetermined portion [Step K2].

Furthermore, an insulating film 2222 is layered [Step L2].

Next, a Ti/Ni/Ti/Ni/Au film is formed on a predetermined area, and thus a first power supply terminal 2210 and a second power supply terminal 2212 are formed [Step M2].

Then, after adjusting the thickness of the SiC substrate 2204 by grinding (not depicted), the SiC substrate 2204 is divided into separate LED array chips by dicing. Thus, the LED array chip 2 (FIG. 1, FIG. 2) is completed [Step N2].

<Embodiment 3>
Structure of LED Array Chip

In Embodiments 1 and 2, each LED is composed of a semiconductor multilayer film having a square shape in plan view. In contrast, an LED array chip 300 pertaining to Embodiments 3, each LED is composed of a semiconductor multilayer film having a regular hexagonal shape in plan view. The width across corner is 2 [mm] in each chip, and is its ⅓ in each light-emitting element.

Figure 21A:
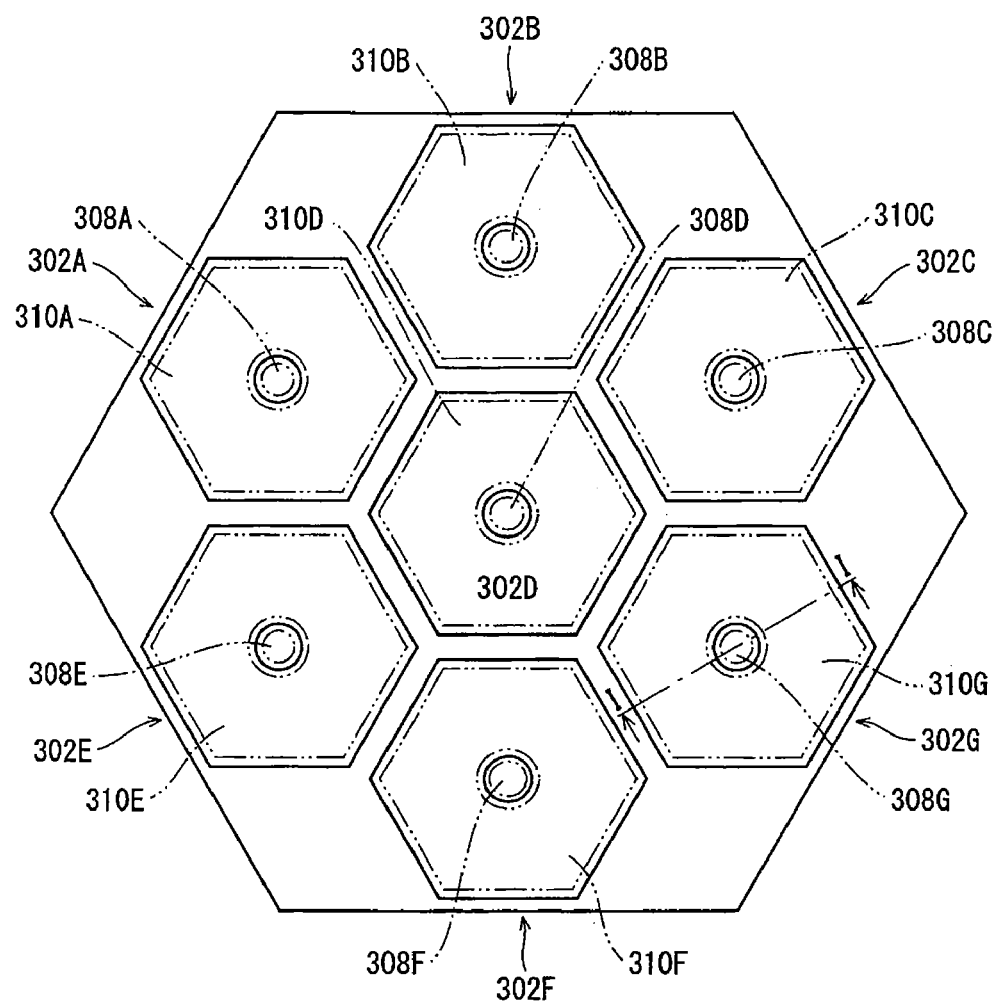
FIG. 21A is a plan view of an LED array chip pertaining to Embodiment 3, showing only seven LEDs formed on a SiC substrate with a high-resistance layer therebetween.

FIG. 21A shows a plan view of the LED array chip 300. Note that FIG. 21A shows only seven out of the LEDs 302A-302G formed on the SiC substrate 304 with the high-resistance layer 306 therebetween. The n-electrodes 308A-308G and the p-electrodes 310A-310G of the LEDs 302A-302G are depicted in two-dot chain lines.

Figure 21B:
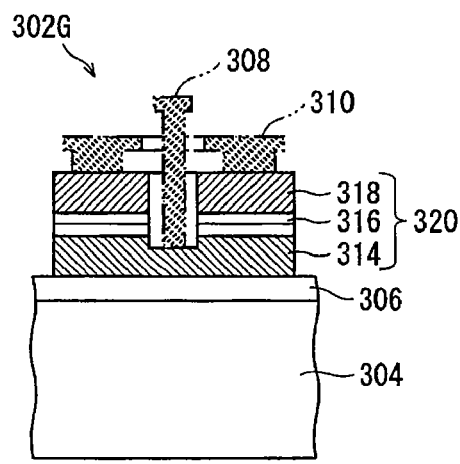
FIG. 21B is a cross-sectional view of the LED array chip cut along a line corresponding to the line I-I in FIG. 21A.

FIG. 21B is a cross-sectional view of the LED array chip 300 cut along the line I-I in FIG. 21A.

All the LEDs 302A-302G have the same structure, and thus the LED 302G shown on the I-I cross section is explained as a representative. In Embodiment 3, as in Embodiments 1 and 2, the common components of the LEDs are given the same reference numbers, and when it is necessary to distinguish one LED from another, an alphabet (i.e. A-G) follows the reference number.

The LED 302G has basically the same structure as the LEDs in Embodiments 1 and 2, except that the LED 302G has a regular hexagonal shape in plan view. That is, as shown in FIG. 21B, the LED 302G is composed of a semiconductor multilayer film 320 including: an n-GaN layer 314, a light-emitting layer 316, and a p-GaN layer 318. These layers are formed on a high-resistance layer 306 on the SiC substrate 304 in the stated order. Note that the high-resistance layer 306 of Embodiment 3 is composed of an AlGaN/AlN multilayer film. Thus, the high-resistance layer 306 also serves as a light reflecting layer (DBR layer: Distributed Bragg Reflector layer) which efficiently reflects light.

When the light reflecting layer 306 is disposed between the light-emitting layer 316 and the SiC substrate 304 as with the present Embodiment, light from the light-emitting layer does not pass through the SiC substrate. In such a case, a substrate with a low visible-light transmittance, such as of Si, Ge, or GaAs, or a metal substrate that does not transmit light, such as of Ag or Al, may be used instead of the translucent substrate as used in the Embodiments 1 and 2.

A hole 322 is provided in the center of the semiconductor multilayer film 320 in plan view. The hole 322 penetrates through the p-GaN layer 318 and the light-emitting layer 316, and reaches the n-GaN layer 314. An n-electrode 308 having a columnar shape is provided in the hole 322. The n-electrode 308 connects to the n-GaN layer 314 at the bottom of the hole 322. Also, a p-electrode 310 is provided on the top surface of the p-GaN layer 318. The p-electrode 310 has an annular shape surrounding the opening of the hole 322.

Figure 22A:
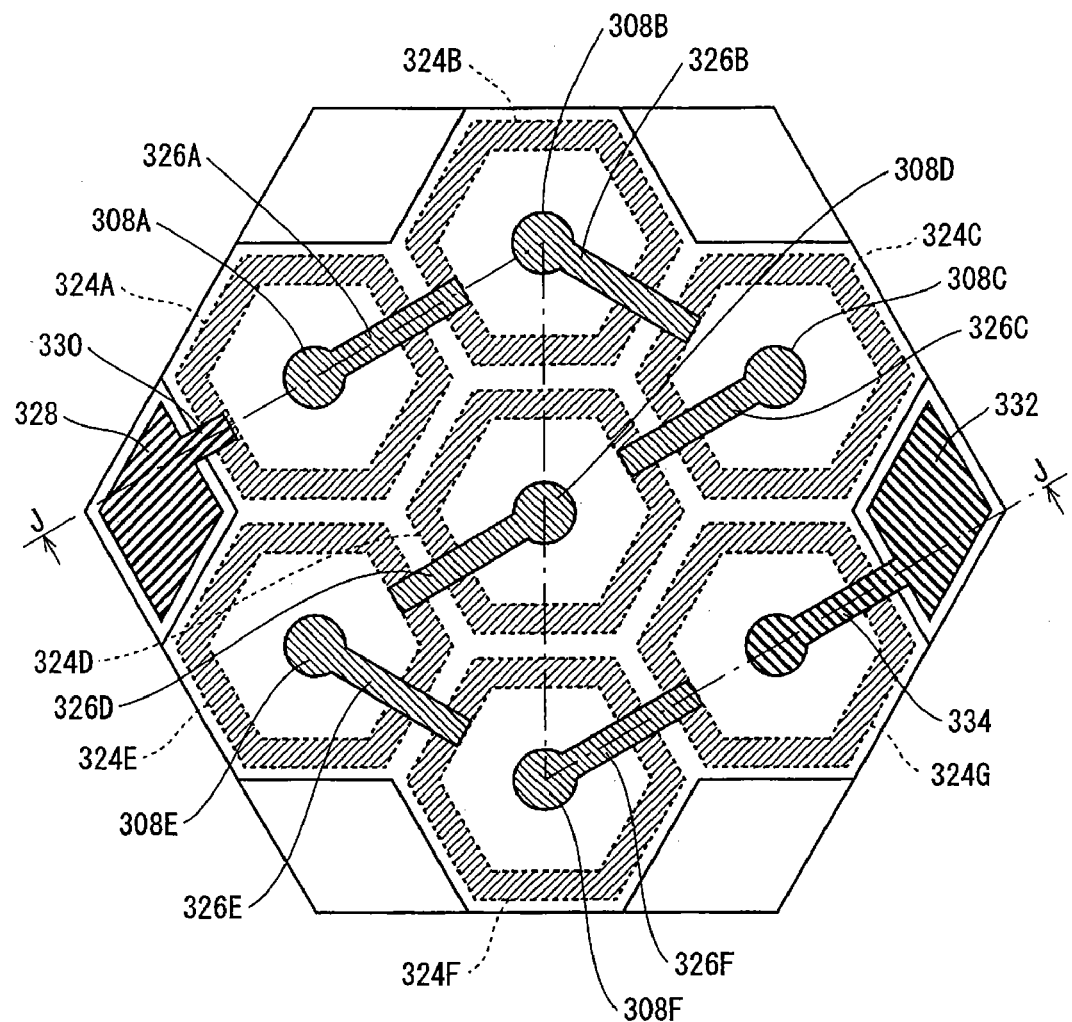
FIG. 22A is a plan view of a wiring pattern of the LED array chip pertaining to Embodiment 3.

As in the Embodiments 1 and 2, the LEDs 302A-302G are electrically connected via wires made of metal thin films FIG. 22A shows the wiring pattern of the LED array chip 300 in plan view. FIG. 22A is a plan view of the LED array chip 300 from which a phosphor film 342 has been removed. The phosphor film 342 will be described later in detail. In FIG. 22A, only the wires 324, which will be described later, are depicted within the LED array chip 300 in dashed lines.

Figure 23A:
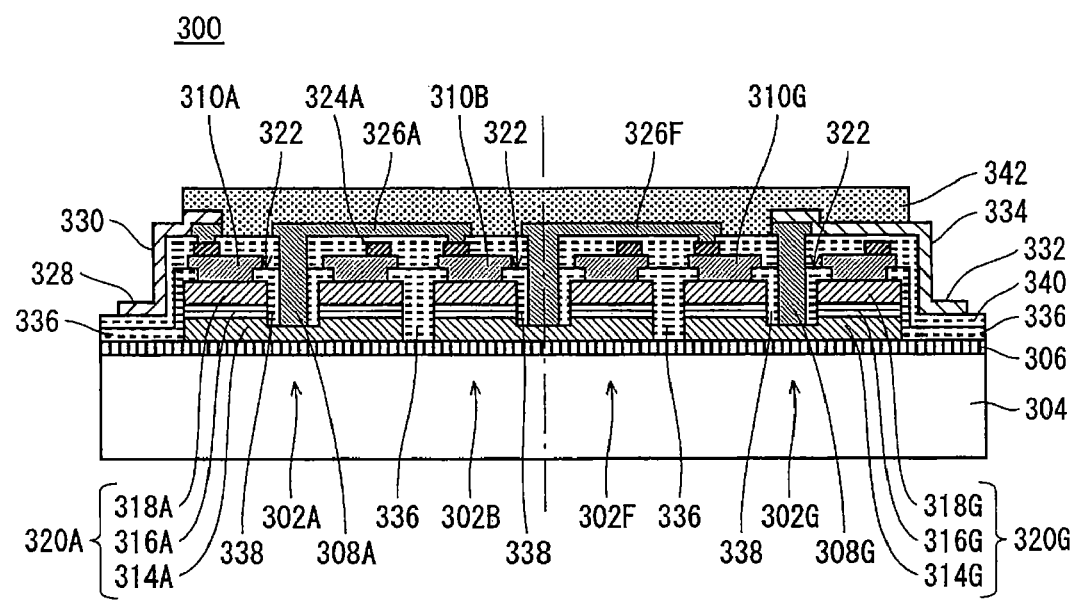
FIG. 23A is a cross-sectional view of the LED array chip pertaining to Embodiment 3 cut along a line corresponding to the line J-J in FIG. 22A.
Figure 23B:
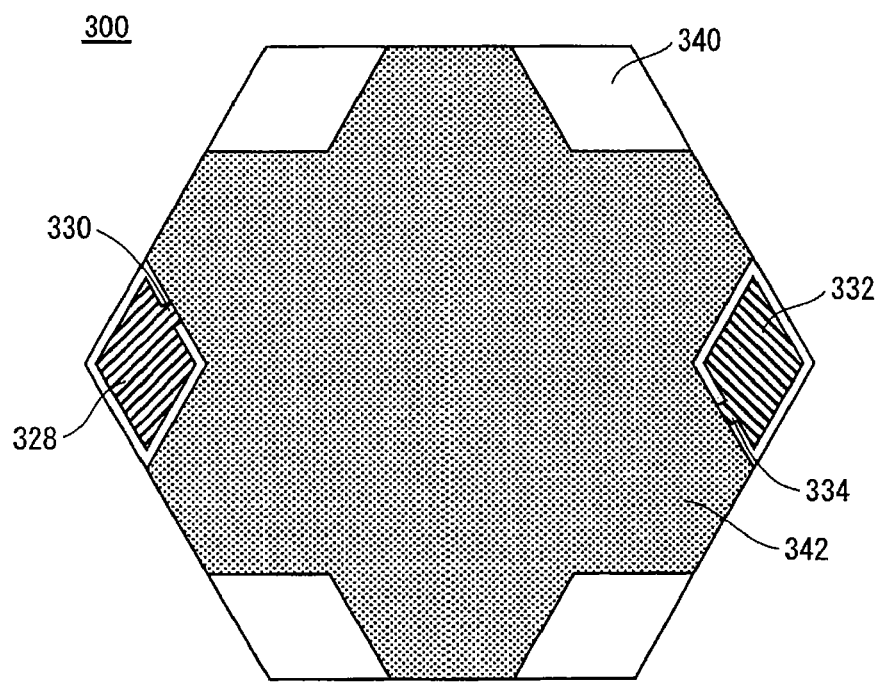
FIG. 23B is a plan view of the LED array chip.

FIG. 23A shows a cross-sectional view of the LED array chip 200 cut along a line corresponding to the line J-J in FIG. 22A.

In FIG. 22A, the reference sings 324A-324G indicate the wires to which the respective p-electrodes 310A-310G of the LEDs 302A-302G are connected. Each of the wires 324A-324G has a closed ring-like shape, and is connected to the whole periphery of the corresponding one of the p-electrodes 310A-31OG which also has an annular shape.

The circular portions, seen in the centers of the areas surrounded by the wires 324A-324G respectively, are end surfaces of the n-electrodes 308A-308G of the LEDs 302A-302G (Note that the end surface of the n-electrode 308G is not shown in FIG. 22A as being concealed under the wire 334 which will be described later).

Figure 22B:
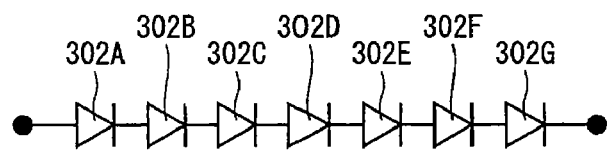
FIG. 22B is a circuit diagram of the LED array chip.

As shown in FIG. 22B, all the seven LEDs 302A-302G are serially connected via the wires. The every two adjacent LEDs are connected in the same manner. Thus, the connection between the LED 302A and the LED 302B is described here as a representative.

As shown in FIG. 23A, the n-electrode 308A of the LED 302A and the p-electrode 310B of the LED 302B are electrically connected via the wire 326A. Thus, the LED 302A and the LED 302B are serially connected. As shown in FIG. 22A, the LEDs 302B-302G are serially connected via the wires 326B-326F, respectively. The wires 326B-326F are similar to the wire 326A.

As shown in FIG. 23A, the wire 324A connected to the p-electrode 310A of the LED 302A, which is the high-potential end of the serially connected LEDs 302A-302G, is connected to the second power supply terminal 328 via the wire 330. The n-electrode 308G of the low-potential end LED 302G is electrically connected to the first power supply terminal 332 via the wire 334.

The first power supply terminal 332 and the second power supply terminal 328 on the SiC substrate 304 are formed outside the area where the LEDs 302A-302G are formed. One ends of bonding wires are connected to the first power supply terminal 332 and the second power supply terminal 328, and the other ends are connected to the lands and the likes of the mounting board of the LED array chip 300. Since the first power supply terminal 332 and the second power supply terminal 328 are formed outside the area where the LEDs 302A-302G are formed, the bonding wires are prevented from overlapping the spaces above the main surfaces of the light-emitting layers 316A-316G of the LEDs 302A-302G. With this structure, light emitted from the light-emitting layers 316A-316G in the direction perpendicular to the main surfaces thereof is prevented from being blocked by the bonding wires.

As with the LED array chip 2 (FIG. 2) and the LED array chip 200 (FIG. 14), the LED array chip 300 may be provided with an insulating film when needed. That is: an insulating film 336 is provided on the side surfaces of each LED 302 and the top surface of the high-resistance layer 306 excluding the areas where the LEDs 302 are disposed; an insulating film 338 is provided between each n-electrode 308 and the internal wall of the hole in the center of its corresponding semiconductor multilayer film 320; and an insulating film 340 is provided between the p-electrode 310 and the wires 324 and 326.

A phosphor film 342 which covers all the LEDs 302A-320G is disposed over the insulating film 340 and the wire 326.

Method for Manufacturing LED Array Chip

Next, a description is given to a method for manufacturing the LED array chip 300 having the stated structure, with reference to FIGS. 24 through 27. FIGS. 24 through 27 are cross-sectional views of the LED array chip 300 on the way of the manufacturing process, cut along the line J-J in FIG. 22A. Note that the materials of the components of the LED array chip 300 in FIGS. 24 through 27 are given reference numbers in the 3000s, and in each of the reference numbers, the last three digits show the reference number given to the corresponding component of the LED array chip 300.

First, the semiconductor multilayer film 3320 is formed by sequentially forming the high-resistance layer 3306, the n-GaN layer 3314, the light-emitting layer 3316 and the p-GaN layer 3318 over the SiC substrate 3304, for example, in the stated order by MOCVD (Metal Organic Chemical Vapor Deposition) [Step A3].

Next, grooves 1004 are provided in the semiconductor multilayer film 3320 by etching to form a honeycomb structure, and portions near the corners of the hexagon, which will constitute the LED array chip 300, are removed in the shape of rhombuses [Step B3]. Then, the semiconductor multilayer film 3320 is divided into portions 3302, each of which will constitute the LED 302, and an area 1006 for mounting a power supply terminal is formed.

A silicon nitride film is formed in each groove 1004, on the side wall of the remaining part of the portions 3302 each serving as the LED 302 and the area 1006 for mounting the power supply terminal. Thus, an insulating film 3336 is formed [Step C3].

Next, as shown in FIG. 25, a hole 322 is provided by etching, in the center of each of the portions 3302 which will constitute the LEDs 302 [Step D3]. Thus, the semiconductor multilayer film 320 including the n-GaN layer 314, the light-emitting layer 316 and the p-GaN layer 318 is formed.

Each hole 322 is filled with an insulating material to form an insulating column 3338, which will constitute the insulating film 338 [Step E3].

An ITO film is formed on the exposed surface of the p-GaN layer 318, and thus the p-electrodes 310 are formed [Step F3].

Next, as shown in FIG. 26, wires 324 are formed for each of the p-electrodes 310 [Step G3].

An insulating film 136, which covers all over the top surfaces of the insulating columns 3338, the p-electrodes 310, the wires 324 and the insulating film 3336, is formed [Step H3].

Next, to form the n-electrodes 308 and the wires 326, a hole (not depicted) is provided in predetermined points in the insulating film 13340 and the insulating columns 3338 by etching, and then a V/Al/Ti/Ni/Au film is formed on a predetermined area. Thus, the n-electrodes 308 and the wires 326 are formed [Step I3].

An insulating film 134 is formed to cover all over the top surfaces of the p-electrodes 26, the top surfaces of the wire 30, and the exposed surface of the insulating film 136 [Step I1].

Next, as shown in FIG. 27, a Ti/Ni/Ti/Ni/Au film is formed on a predetermined area, and thus a first power supply terminal 332, wires 334, a second power supply terminal 328 and wires 330 are formed [Step J3].

A phosphor film 342 which covers all the LEDs 302A-320G is disposed over portions of the wires 330 and the wires 334, the insulating film 3340 and the wire 326 [Step K3].

Then, after adjusting the thickness of the SiC substrate 3304 by grinding (not depicted), the SiC substrate 3304 is divided into separate LED array chips by dicing. Thus, the LED array chip 300 (FIG. 1, FIG. 2) is completed [Step L3].

In the present embodiment, the phosphor film is formed before separating the LED array chips, and it is therefore possible to examine the light emitting characteristics for each of the chips before forming the phosphor film, by feeding power to the first power supply terminal 332 and the second power supply terminal 328 of each. Thus, it is possible to condition the phosphor material in the phosphor layer and the thickness of the phosphor layer to obtain desired white light. Moreover, it is possible to vary the thickness of the phosphor film and the composition of the phosphor material for each of the light-emitting elements. For example, it is possible to realize a structure in which one light-emitting element emits blue light, another light-emitting element emits green light, and yet another light-emitting element emits red light.

The present invention is described above based on the embodiments. The present invention is, however, not limited to the embodiments above. For example, the following modifications can be made.

(1) Each of the embodiments above is explained on the assumption that blue light is to be emitted. However, it is not essential that blue light is emitted from the light-emitting layer, and light of any color may be used as long as it has a wavelength that is appropriate for exciting the phosphor. It is particularly preferable that the light is within the range from UV light to blue-green light. Also, it is not necessary that white light generated by combination is used. For example, monochromatic light such as blue light, green light and red light may be used instead.

(2) Also, it is not essential that the light-emitting layer is made of GaN. The wavelengths of light from the light-emitting elements which constitute the LED array chip may be intentionally made different from each other. For example, it is possible to realize a structure in which one light-emitting layer emits blue light, another light-emitting layer emits green light, and yet another light-emitting layer emits red light. It is possible to realize light of various colors and white light having a high color rendering index, solely with light-emitting layers or with light-emitting layers that are complemented by phosphor films.

(3) In Embodiments 1 and 2 described above, a semiconductor multilayer film is first formed on a SiC substrate, for example, by a crystal growth method, and then the semiconductor multilayer film is divided into portions in units of the LED array chips (i.e. semiconductor light-emitting devices) by dicing.

However, this is not essential. Alternatively, the semiconductor multilayer film may first be transferred to a substrate that will finally constitute the LED array chip, and then be divided on the substrate (i.e. supporting substrate) at an appropriate time (i.e. step), instead of being divided on the substrate (i.e. crystal growth substrate) on which the semiconductor multilayer film has been formed by a crystal growth method. If this is the case, the structure of the semiconductor multilayer film which constitutes each LED in the LED array chip is different from the embodiments described above. That is, the semiconductor multilayer film is formed by sequentially disposing the p-GaN layer, the light-emitting layer and the n-GaN layer on the substrate (i.e. supporting substrate) in the stated order.

INDUSTRIAL APPLICABILITY

A semiconductor light-emitting device pertaining to the present invention is applicable to light sources for bulb-type LED lamps.

REFERENCE SIGNS LIST 4, 204, 304 SiC substrate
12, 202, 302 LED
14, 314 n-GaN layer
16, 316 light-emitting layer
18, 318 p-GaN layer
22, 322 hole
24, 308 n-electrode
26, 310 p-electrode

The invention claimed is:

1. A semiconductor light-emitting device having a substrate on which a semiconductor multilayer film is disposed, the semiconductor multilayer film having a layered structure in which a first conductive layer, a light-emitting layer and a second conductive layer are layered above the substrate from bottom to top in the stated order, and being divided into portions by grooves extending perpendicular to the substrate, each portion having a diode structure and serving as a light-emitting element, each light-emitting element
having a hole in a central portion thereof in plan view, the hole penetrating through the second conductive layer and the light-emitting layer and reaching the first conductive layer, and
comprising:
a first electrode inserted in the hole and having a columnar shape, one end thereof being connected to the first conductive layer at the bottom of the hole, and the other end protruding from an opening of the hole; and
a second electrode formed on the second conductive layer and having an annular shape surrounding the opening of the hole; and
a set of at least two of the light-emitting elements are connected in series such that the first electrode of one light-emitting element is connected to the second electrode of another light-emitting element by a thin-film wire, and
the semiconductor light-emitting device further comprises:
a first power supply terminal connected to the first electrode of one light-emitting element that is located at one end of the series; and
a second power supply terminal connected to the second electrode of another light-emitting element that is located at the other end of the series, wherein
among the light-emitting elements, another set of light-emitting elements, which are different from the at least two light-emitting elements connected in series, are connected in series via a thin-film wire in the same manner as the at least two light-emitting elements, and the set of at least two light-emitting elements and the other set of light-emitting elements are parallely connected so as to be opposite in polarity.

2. The semiconductor light-emitting device of claim 1, wherein
the first and the second power supply terminals are formed from a metal film, the metal film being located above main surfaces of the light-emitting elements with an insulating film therebetween, and covering the entire main surfaces in plan view, except a minimum gap required for insulation, each main surface being farther from the substrate than the opposite surface to the main surface is.

3. The semiconductor light-emitting device of claim 1, wherein
each thin-film wire extends along an entire periphery of the corresponding second electrode, and is thus connected to the second electrode.

4. The semiconductor light-emitting device of claim 1, wherein
each second electrode is made of a translucent material, and
the first and the second power supply terminals are disposed on an area that is on the same side of the substrate as the light-emitting elements and that is outside an area where the light-emitting elements are disposed.

5. The semiconductor light-emitting device of claim 1, wherein
the substrate is translucent, and
each second electrode is made of a conductive material with a high reflectivity.

6. The semiconductor light-emitting device of claim 1, wherein
the first conductive layer is disposed above the substrate, with a high-resistance layer therebetween.

7. The semiconductor light-emitting device of claim 1, wherein
each second electrode is made of a translucent material, and a light reflecting film is disposed on a main surface of the second electrode with an insulating film therebetween, the main surface being farther from the substrate than the opposite surface to the main surface is.

8. The semiconductor light-emitting device of claim 1, wherein
a light reflecting layer is disposed between the substrate and the first conductive layer.

9. The semiconductor light-emitting device of claim 1, wherein
a wavelength conversion film is disposed to cover main surfaces of the light-emitting elements, the wavelength conversion film converting light from the light-emitting layer to light with a longer wavelength, and each main surface being farther from the substrate than the opposite surface to the main surface is.

10. A light-emitting module having the semiconductor light-emitting device defined in claim 1.

11. An illumination device having the light-emitting module defined in claim 10.

* * * * *